United States Patent
Drowley et al.

(10) Patent No.: US 7,312,484 B1
(45) Date of Patent: Dec. 25, 2007

(54) PIXEL HAVING AN OXIDE LAYER WITH STEP REGION

(75) Inventors: Clifford I. Drowley, Scottsdale, AZ (US); Ching-Chun Wang, Lexington, MA (US); Jungwook Yang, Waban, MA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/350,298

(22) Filed: Feb. 7, 2006

Related U.S. Application Data

(62) Division of application No. 10/752,845, filed on Jan. 7, 2004.
(60) Provisional application No. 60/438,684, filed on Jan. 8, 2003.

(51) Int. Cl.
   *H01L 31/0328* (2006.01)
(52) U.S. Cl. .............. 257/187; 257/184; 257/225; 257/231; 257/257; 257/290; 257/461; 257/E31.058; 257/E27.133
(58) Field of Classification Search ........ 257/184, 257/187, 192, 201, 222, 226, 291, 461, 509, 257/927, 225, 231, 257, 258, 290, 292, 462
See application file for complete search history.

(56) References Cited

U.S. PATENT DOCUMENTS

| 6,177,293 | B1 | 1/2001 | Netzer et al. |
| 6,232,626 | B1 | 5/2001 | Rhodes |
| 6,350,663 | B1 | 2/2002 | Kopley et al. |
| 6,521,926 | B1 * | 2/2003 | Sasaki .............. 257/292 |

\* cited by examiner

*Primary Examiner*—Wai-Sing Louie
(74) *Attorney, Agent, or Firm*—Blakely, Sokoloff, Taylor & Zafman LLP

(57) ABSTRACT

A semiconductor structure, having a doped well region being formed in a substrate layer and a transistor having a terminal provided within said doped well region. The semiconductor structure also includes an oxide layer formed over the substrate layer, the doped well region, a poly silicon region, and the terminal of the transistor. The oxide layer including a step region being located where a height of the oxide layer transitions from a height associated with the doped well region to a height associated with the terminal of the transistor.

19 Claims, 14 Drawing Sheets

PIXEL HAVING AN OXIDE LAYER WITH STEP REGION

REFERENCE TO RELATED APPLICATIONS

This application is a divisional of U.S. application Ser. No. 10/752,845 filed Jan. 7, 2004, which claims priority under 35 U.S.C. §119(e) of U.S. Provisional Application No. 60/438,684 filed Jan. 8, 2003, which are hereby incorporated by reference.

FIELD OF THE PRESENT INVENTION

The present invention relates to imaging devices and, in particular, to complementary metal-oxide semiconductor (CMOS) image sensors having photodiodes with gated junctions to substantially reduce extraneous leakage current that induces fixed pattern and random noise.

BACKGROUND OF THE PRESENT INVENTION

CMOS image sensors are attractive for use in, e.g., still and video imaging applications, due to their compatibility with VLSI circuit design and fabrication processing. For many applications, a CMOS imager can be preferred over a corresponding CCD imager. Specifically, low-cost, large-scale CMOS design and fabrication technologies that have been developed for large-volume VLSI circuits can be directly employed in the production of CMOS imagers. CMOS imagers are, in general, much more cost effective than imagers produced based on CCD technologies.

A CMOS imager sensor measures the magnitude of photo-current generated from photons falling onto the sensor. In CMOS imagers, imager pixels must hold, or maintain, image information produced by the pixels in the form of an electronic charge for a period of time that is typically on the order of about 10-100 milliseconds. Given this time scale, and due to the micron or submicron scale structure of CMOS pixels, any electronic leakage current generated at a pixel tends to substantially affect the image information maintained by the pixel, resulting in a distortion of the image produced by the imager.

A lower leakage current is essential for solid state image sensor arrays since leakage current causes excess "signal" even though no light is shining on the sensor. The leakage current is combined with the photo-current and introduces temporal and spatial noise to the desired photo-signal of the array. Unfortunately, there is no simple way to distinguish the leakage component from the overall signal.

Reduction of leakage current is also important for imaging at low light levels since the ratio of leakage component to the total signal is higher. Leakage current usually varies pixel-by-pixel, which causes fixed pattern noise on the image plane. Additionally, the temporal variation of leakage current is a source of pixel random noise. The statistical properties of leakage current variation dictate that a higher leakage current is associated with a wider distribution of leakage current, both spatially and temporally, degrading noise performance. Therefore, leakage current reduction becomes an important topic for sensor performance improvement.

This leakage current, also referred to as "dark current," is understood to be due to the generation of electron-hole pairs in a depletion region where pixel charge is held. Leakage current can be caused by thermally generated holes and electrons and/or by electron-hole pair generation at material defects in the semiconductor substrate in which the pixels are fabricated.

Thermally-produced leakage current is a fundamental phenomenon that sets the minimum leakage current which generally can be attained by state-of-the-art pixel design. Leakage current produced by material defects can, however, be addressed and is found to be design and process dependent.

Leakage current produced by material defects typically results from crystal dislocations in the silicon substrate in which the pixels are fabricated. Defects at the silicon substrate surface ("surface states") also can serve as generation centers for leakage current. Sites of crystal dislocations act as electron-hole pair generation centers that produce a corresponding current, known as a leakage current. As a result of the leakage current, a pixel can produce an output image signal even under dim or zero illumination conditions. Thus, for any input illumination, the leakage current contribution to the pixel output distorts the image, rendering the indicated illumination brighter than the true illumination.

At a very high leakage current, the pixel output can become saturated even under zero illumination conditions. In this situation, the pixel is completely unresponsive to varying scene illumination and produces only the saturation output level. In this case, the pixel is often termed "defective" and is effectively not operative for imaging applications.

It is understood that a reduction in pixel leakage current can be obtained by the reduction in the number of the dislocations in the crystal lattice of a silicon substrate in which a pixel is fabricated, or by a reduction in the surface states at the silicon surface. Such dislocations can be formed in the substrate, near to the substrate surface, at locations of steps between a region of thin silicon dioxide and a region of thicker silicon dioxide provided on the substrate surface. At the boundary of a thin-oxide/thick-oxide step, mechanical stress is imposed on the silicon substrate, causing crystal lattice dislocations to form in the substrate, relatively close to the substrate surface.

If a crystal lattice dislocation in the silicon substrate is formed at a substrate location that falls within the extent of a photogenerated charge sensing depletion region of a CCD or CMOS pixel, or at the location of pixel regions that are electrically connected to, and thus at the same electrical potential as the photodiode region, that dislocation can act as an electron-hole pair generation center, as explained above, producing a contribution to pixel output that is not representative of input illumination. This leakage of current distorts the electronic charge maintained by the pixel and at high current levels, renders the pixel defective.

A requirement for control of pixel leakage current has been addressed in general in conventional CCD imager fabrication technologies, with a range of design and fabrication remedies developed to reduce pixel leakage current. High performance CCD imager technologies can maintain pixel dark current to a level as low as on the order of 20-100 $pA/cm^2$.

It is found, however, that in general, the minimum dark current obtainable by CMOS imager technologies is typically more than an order of magnitude greater than that obtainable by CCD imager technologies. In addition to being characterized by a larger average dark current than CCD imagers, CMOS imagers are in general found to be susceptible to a far larger number of defective pixels than CCD imagers.

While CCD imager technologies have been able to address the challenge of average dark current minimization and a reduction in number of defective pixels through fabrication process modifications, these CCD imager technologies require design or fabrication process modifications that are not, in general, cost effective or practical for CMOS imager technologies.

This is due to the fact that VLSI circuits produced by standard CMOS manufacturing processes, which are also employed for CMOS imagers, are largely unaffected by current leakage, and the principal advantage of CMOS imager technology is its use of such standard CMOS VLSI processing techniques. Any CMOS process modifications employed to reduce leakage current are therefore costly and inefficient, benefiting imager but not VLSI circuit applications.

The various features of a CMOS pixel design layout that contribute to pixel leakage current can be illustrated with an example pixel design and corresponding fabrication layouts.

FIG. 12 shows the top view of a p-n junction diode typically used as a CMOS image sensor, and FIG. 13 shows the cross-section through line 12-12 of such a diode sensor structure. The operation of the sensor is the following.

During the sensor reset phase, the n-type region 310 is connected to a high voltage and p-type region 41 is tied to ground. Then the high voltage is disconnected from the n-type region 310 and the diode is floating.

At this point, the p-n junction diode can be treated as a charged capacitor. The depletion region 260 of the p-n junction is widened and the electric field inside the region facilitates the electron-hole pair separation as the carriers are generated by photon absorption. The separated carriers form photo-current, which discharges the junction capacitor and decreases the voltage across the junction. The reduction of junction voltage within a defined period of time represents the magnitude of the photo-signal.

However, besides the photo-charges, other charges may be generated within the depletion region 260 by other mechanisms, or a current path across the junction could also discharge the junction capacitor and causes some false signal when there is no illumination on the sensor. As noted above, the summation of the undesired current is generally called leakage current.

In another example as illustrated in FIG. 1, the operation of a CMOS active pixel 10 is described in more detail, using a schematic diagram of the pixel. This example pixel configuration employs a photodiode 11, but it is to be recognized that the pixel can include other light collecting configurations, embodied as, e.g., a phototransistor, a photogate, or other selected configuration.

As illustrated in FIG. 1, a photodiode 11 of the pixel produces a current of photo-generated electrical charge in response to light incident on the pixel. The resulting photocurrent is directed to a parasitic charge-sensing capacitor 13. The parasitic charge-sensing capacitor 13 is not an actual physical electrical element of a pixel, but the parasitic charge-sensing capacitor 13 represents the parasitic reverse-biased P-N junction capacitance and other parasitic capacitance associated with the photodiode 11 and sense node 40.

A MOS transistor 15 operates as a source follower transistor that buffers the voltage on the parasitic charge-sensing capacitor 13 nondestructively to a column line 23 for read out of the voltage. Specifically, a row select MOS switch 17 activates the source follower transistor 15 when the particular row is selected, thereby enabling the parasitic charge-sensing capacitor voltage measurement. When the row select MOS switch 17 of the row is turned ON, a current source 24 is connected to the source of the MOS transistor 15. The MOS transistor 15 and the current source 24 operate as a source-follower configuration to buffer the voltage on the parasitic charge-sensing capacitor 13 to the column line 23 for determining the parasitic charge-sensing capacitor voltage at the end of an exposure period, to in effect measure the photo-generated electronic charge held by the pixel. A sense node 40 is the point in the circuit at which the parasitic charge-sensing capacitor voltage is electrically contacted for producing an output voltage to the column line 23.

FIG. 2 illustrates a top view of a conventional CMOS fabrication process layout for the pixel configuration of FIG. 1. FIG. 3 is a cross-sectional view of the conventional CMOS fabrication process layout taken at the section 3 of FIG. 2.

As illustrated in FIG. 2, the photodiode 11 is constructed between an n+ doped area 30 and a p-type substrate 41. The n+ doped area 30 acts as the cathode and the p-type substrate 41 as anode of the photodiode 11. The n+ doped area 30 is doped, typically by ion implantation, simultaneously with the doping of source and the drain areas (generally denoted as 33, 35, 37, and 39) of the NMOS transistors of the pixel.

With this configuration, the n+ cathode region of the photodiode 11 is extended out to form an n+ source 39 of the reset transistor 21 of FIG. 1. As illustrated in FIG. 2, the sense node contact 400 of the pixel is provided at the source location 39. Electrically, the n+ cathode area of the photodiode 11 as well as the source area 39 of the reset transistor 21 together form the sense node 40 of FIG. 1. The gate of the source follower transistor 15 is connected to the sense node 40 of FIG. 1 at the sense node contact point 400. The drain of the row select transistor 17 is connected to the source of the transistor 15 through n+ doped area 35.

In accordance with conventional CMOS fabrication processing, the p-type substrate 41, surrounding doped active device regions like the photodiode region 30 and the source and drain regions (33, 35, 37, and 39), is typically provided with a relatively thick silicon dioxide layer, known as the field oxide. The silicon dioxide layer in the p-type substrate 41 is about 2000 Å-5000 Å in thickness.

The field silicon dioxide layer is provided with sufficient thickness to disable transistor action by polysilicon traces overlaying the oxide in their connection paths between various nodes of the transistors. In the areas forming the n+ source and drain areas, the gate areas, and the photodiode area, commonly referred to together as the "active area," the thick field silicon dioxide layer is inhibited and in place is provided a very thin oxide layer having a thickness corresponding to the prescribed gate oxide for the transistors.

As illustrated in FIG. 3, an example of CMOS process employing shallow trench isolation technology is shown. More specifically, as illustrated in FIG. 3, a step 43 in height between the field oxide layer 42 and the thinner oxide layer 44 overlaying the active area, including the n+ photodiode area 30, is shown in cross section. Under reverse bias conditions, a depletion region 50 is formed between the n+ photodiode area 30 and the p-type substrate 41, with the depletion region 50 extending deeper into the substrate than the photodiode area due to the lower doping level in the substrate relative to the photodiode area.

Dislocations 55 tend to form in the p-type substrate 41, near to the p-type substrate's surface, at a region near to where the step 43 in oxide height is located, due to mechanical stress imposed on the p-type substrate 41 by the step 43. Such dislocations, which will typically fall in the depletion region 50, act as electron-hole pair generation centers, producing a leakage current. The leakage current contribution to the pixel output is not based on pixel illumination, but instead on a dislocation generated current.

In the pixel layout of FIG. 2, the entire perimeter of the photodiode 30 and the region of the sense node contact 400; i.e., the entire perimeter of the photodiode area 30 as well as the reset transistor source area 39, where the sense node contact 400 is made, is characterized by a step in oxide layer thickness across the boundary of these regions.

As a result of this step in the oxide layer, the entire perimeter of the photodiode area 30 as well as the reset transistor source area 39 provides a region in which dislocations can form and excessive pixel leakage current can be produced. Thus, large average dark currents and a high density of defective pixels are typically found in CMOS imagers with this pixel layout.

FIG. 4 illustrates another conventional CMOS fabrication process layout for a pixel. In FIG. 4, the photodiode area 300 is not formed by the n+ doping implantation employed for the transistor source and drain regions 33, 35, 37, and 25. Instead, the photodiode 11 is formed simultaneously with the n-type doping of n-wells produced in the substrate for forming PMOS circuits. This n-well formation is a fabrication process step separate from the n+ source and drain formation, in a conventional manner. In the configuration illustrated in FIG. 4, the sense node contact 400 is provided at the reset transistor source region 25, and the photodiode 11 and the reset transistor source are connected by extending a portion of the reset transistor source region 25 of the transistor 21 into the n-well region 300 of the photodiode 11 by forming an n+ well in the n-well region 300 of the photodiode 11.

In an example process for fabricating the configuration illustrated in FIG. 4, the photodiode area 300 is doped with the n-well doping and is thereafter covered with a thick field oxide layer along with the field surrounding the areas defined for the transistors. The regions (33, 35, 37, and 25) for defining the pixel transistors are provided with a thin gate oxide layer. A step in oxide layer height also exists across the boundaries 70 and 72 of the reset transistor source region 25 in which the sense node contact 400 is provided. This height step across the boundaries 70 and 72 of the reset transistor source region 25, where the sense node contact 400 is formed, causes dislocations and a corresponding leakage current to be produced at the sense node 40.

The average dark current of a pixel having this layout is substantially reduced compared with the pixel design of FIG. 2 because there exists no thin-thick oxide boundary along the perimeter of the n-well photodiode area 300. However, since a thick-thin oxide step does exist at the perimeter of the reset transistor source region 25, where the sense node contact 400 is provided, dislocations do exist and hence excessive leakage current and defect pixel density are not completely eliminated.

As noted above, a typical mechanism for leakage current generation is the defect levels within silicon bandgap, especially inside the depletion region. The defect density determines how fast the dark-current charges can be generated at a specific temperature and the density of defects is strongly related with the processing technology used to build the sensors. Additionally, there could be some charged surface states residing near the silicon-silicon dioxide interface adjacent to layer junctions that were introduced during wafer processing (e.g. by plasma processes). The charged surface states could possibly form a depletion region or a weak channel between photodiode junctions along the junction surface and either increase generation current or cause a leakage current path.

Therefore, it is desirable to provide a pixel design and corresponding fabrication process that results in a CMOS pixel imager having substantially reduced leakage current.

As discussed above, since dislocations at step regions in the oxide layer are consistent by-products of the fabrication process, it is desirable to reduce the detrimental leakage current effect of these dislocations upon a CMOS pixel; namely, the effect upon the CMOS pixel's capability to convert illumination levels into a voltage properly; without removing or decreasing the number of dislocations.

It is further desirable to reduce the detrimental leakage current effect of the dislocations produced by the fabrication process without altering the standard fabrication process. It is desirable to reduce the detrimental leakage current effect of the dislocations produced by the fabrication process without requiring additional processing steps, additional backend processes, or non-standard process sequences.

Moreover, it is desirable to mask the detrimental leakage current effect of the dislocations produced by the fabrication process. Lastly, it is desirable to reduce the detrimental leakage current effect of the dislocations produced by the fabrication process by using a standard CMOS fabrication process that has not been modified with expensive fabrication steps.

Furthermore, it is desirable to provide a fabrication process that prevents any process damage to the p-n junction region from being introduced after poly silicon processing.

Lastly, it is desirable to provide a photodiode having its p-n junction physically shielded to prevent any process damage from being introduced after the poly silicon processing (including damages from processes such as dielectric deposition/pattern, metal deposition/pattern and via/contact hole etching) and/or provide a photodiode having its p-n junction electrically shielded to prevent any possible trapped charges at higher levels of dielectric above the junctions to affect the surface potential and/or prevent the formation of conducting channels between the p-n regions, thereby reducing leakage current.

SUMMARY OF THE PRESENT INVENTION

A first aspect of the present invention is a photodiode sensor structure. The photodiode sensor structure includes a first dopant type substrate having a first surface; a second dopant type well region having a second surface, the second dopant type well region being formed in the first dopant type substrate such that the first surface and the second surface are substantially co-planar to form a diode surface and an interface between the second dopant type well region and the first dopant type substrate at the diode surface forms a diode junction; and a poly silicon region formed over substantially all of the diode junction.

A second aspect of the present invention is a photodiode sensor structure. The photodiode sensor structure includes a first dopant type substrate having a first surface; a second dopant type well region having a second surface, the second dopant type well region being formed in the first dopant type substrate such that the first surface and the second surface are substantially co-planar to form a diode surface and an interface between the second dopant type well region and the first dopant type substrate at the diode surface forms a diode junction; and a shield formed over substantially all of the diode junction to prevent physical damage to the diode junction during post silicon processing deposition, patterning, or etching.

A third aspect of the present invention is a photodiode sensor structure. The photodiode sensor structure includes a first dopant type substrate having a first surface; a second dopant type well region having a second surface, the second dopant type well region being formed in the first dopant type substrate such that the first surface and the second surface are substantially co-planar to form a diode surface and an interface between the second dopant type well region and the first dopant type substrate at the diode surface forms a diode junction; and an electric shield formed over substantially all of the diode junction.

A fourth aspect of the present invention is a semiconductor structure. The semiconductor structure includes a substrate layer of a first dopant type having a first surface; a doped well region having a second surface and being of a second dopant type, the doped well region being formed in the substrate layer such that the first surface and the second surface are substantially co-planar to form a diode surface and an interface between the doped well region and the substrate layer at the diode surface forms a diode junction; a poly silicon region formed over substantially all of the diode junction; a transistor having a gate and a terminal, the terminal of the transistor being provided within the doped well region, the terminal of the transistor being of the second dopant type and of a dopant concentration greater than a dopant concentration of the doped well region, the gate of the transistor being formed over a portion of diode junction; and an oxide layer formed over the substrate layer, the doped well region, the poly silicon region, and the terminal of the transistor. The oxide layer has a varying height such that a height of the oxide layer associated with the doped well region is thicker than a height of the oxide layer associated with the terminal of the transistor. The oxide layer includes a step region, the step region being located where the height of the oxide layer transitions from the height associated with the doped well region to the height associated with the terminal of the transistor. The oxide layer has a constant height across a perimeter of the doped well region that forms a depletion region with the substrate when a reverse bias voltage is applied across the substrate layer and the doped well region.

A fifth aspect of the present invention is a semiconductor imager structure. The semiconductor imager structure includes a substrate layer of a first dopant type having a first surface; a well region having a second surface and being of a second dopant type, the well region being formed in the substrate layer such that the first surface and the second surface are substantially co-planar to form a diode surface and an interface between the well region and the substrate layer at the diode surface forms a diode junction; and a poly silicon region formed over substantially all of the diode junction. The well region is of a predetermined shape having a multitude of corners, a plurality of the corners of the well region being non-right angles.

A sixth aspect of the present invention is a pixel site of a semiconductor imager structure. The pixel site includes a substrate layer of a first dopant type; a photodiode being formed of a doped well region within the substrate layer, the doped well region being of a second dopant type, the substrate layer having a first surface, the doped well region having a second surface, the doped well region being formed in the substrate layer such that the first surface and the second surface are substantially co-planar to form a diode surface and an interface between the doped well region and the substrate layer at the diode surface forms a diode junction; a poly silicon region formed over substantially all of the diode junction; a transistor wherein a terminal of the transistor being provided within the doped well region of the photodiode, the terminal of the transistor being of the second dopant type and of a dopant concentration greater than a dopant concentration of the doped well region of the photodiode; and an oxide layer formed over the substrate layer, the doped well region of the photodiode, the poly silicon region, and the terminal of the transistor. The oxide layer has a varying height such that a height of the oxide layer associated with the doped well region of the photodiode is thicker than a height of the oxide layer associated with the terminal of the transistor. The oxide layer includes a step region, the step region being located where the height of the oxide layer transitions from the height associated with the doped well region of the photodiode to the height associated with the terminal of the transistor. The oxide layer has a constant height across a perimeter of the doped well region of the photodiode that forms a depletion region with the substrate when a reverse bias voltage is applied across the substrate layer and the doped well region of the photodiode.

A seventh aspect of the present invention is a semiconductor imager structure. The semiconductor imager structure includes a substrate layer of a first dopant type; a photodiode, the photodiode region being provided as a well region formed within the substrate layer, the well region of the photodiode being of having a second dopant type, the substrate layer having a first surface, the well region having a second surface, the well region being formed in the substrate layer such that the first surface and the second surface are substantially co-planar to form a diode surface and an interface between the well region and the substrate layer at the diode surface forms a diode junction; a poly silicon region formed over substantially all of the diode junction; a transistor electrically connected to the photodiode and having a terminal that has a same electrical potential as the photodiode, the terminal of the transistor being of the second dopant type and of a dopant concentration greater than a dopant concentration of the well region of the photodiode; and an oxide layer. The well region of the photodiode has an extended portion so that at least a portion of the terminal of the transistor having the same electrical potential as the photodiode is formed within the extended portion of the well region of the photodiode. The oxide layer is provided over the substrate layer, the well region of the photodiode, and the terminal of the transistor. The oxide layer has a varying height such that a height of the oxide layer associated with the well region of the photodiode is thicker than a height of the oxide layer associated with the terminal of the transistor. The oxide layer includes a step region, the step region being located where the height of the oxide layer transitions from the height associated with the well region of the photodiode to the height associated with the terminal of the transistor. The oxide layer has a constant height across a perimeter of the well region of the photodiode that forms a depletion region with the substrate when a reverse bias voltage is applied across the substrate layer and the well region of the photodiode.

A further aspect of the present invention is a pixel site of a semiconductor imager structure. The pixel site includes a photodiode formed in a substrate layer of a first dopant type; a transistor connected to the photodiode, the photodiode being provided as a well region within the substrate layer, the well region being of a second dopant type, wherein a depletion region is formed around a perimeter of the well region when a reverse bias voltage is applied across the substrate layer and the well region, the substrate layer having a first surface, the well region having a second surface, the well region being formed in the substrate layer such that the first surface and the second surface are substantially co-planar to form a diode surface and an interface between the well region and the substrate layer at the diode surface forms a diode junction; and a poly silicon region formed over substantially all of the diode junction. The transistor includes a source, a drain, and a gate, the source being provided as a region of source dopant within the well region, the source dopant being of the second dopant type and of a dopant concentration that is higher than a dopant concentration of the well, the gate extending over a portion of the well region located between the source and drain regions.

A further aspect of the present invention is an imaging array. The imaging array includes a plurality of pixel sites. Each pixel site has a first dopant type substrate having a first surface and a second dopant type well region having a second surface. The second dopant type well region is formed in the first dopant type substrate such that the first surface and the second surface are substantially co-planar to form a diode surface. An interface between the second dopant type well region and the first dopant type substrate at the diode surface forms a diode junction. Each pixel site also has a poly silicon region formed along a periphery of the diode junction.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
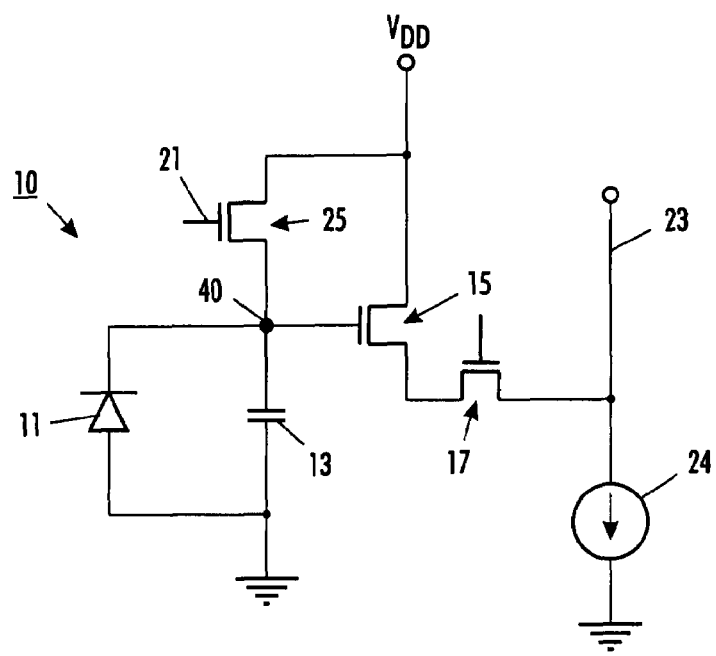
FIG. 1 is a conventional circuit diagram of a CMOS pixel.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

For purposes of describing the present invention, the term "well region" is being used to describe a doped substrate region in which a shallower doped region can be formed. A well region, for the purposes of describing the present invention, is not limited only to a region where transistors are built. A well region, as used in describing the concepts, features, and advantages of the present invention, has a broader meaning in that it is a region within a substrate wherein a dopant is provided typically extending from the substrate surface down to a typically relatively deep depth into the substrate, wherein the region also can include a shallow doped region therein. With respect to the present invention, the well region may be formed from an n-type dopant or a p-type dopant.

Moreover, for purposes of describing the present invention, the term "within the well region" is being used to describe a location of a shallower concentrated-doped region with respect to a doped well region. Within the well region, for the purposes of describing the present invention, may indicate that the doped well region substantially surrounds the shallower concentrated-doped region. Within the well region, for the purposes of describing the present invention, may also indicate a shallower concentrated-doped region located within a doped well region wherein one or more of the edges of the shallower concentrated-doped region actually coincide or line-up with one or more of associated edges of the doped well region. In other words, according to the concepts of the present invention, the final fabrication of a shallower concentrated-doped region provided within a doped well region may result in the doped well region substantially surrounding the shallower concentrated-doped region or the doped well region surrounding a portion of the shallower concentrated-doped region wherein one or more of the edges of the shallower concentrated-doped region coincide or line-up with one or more of associated edges of the doped well region. The edge or edges of the doped well region do not need to extend beyond an associated edge of the shallower concentrated doped region to be realized as being within the doped well region, according to the concepts of the present invention.

Additionally, for purposes of describing the invention, the term "poly silicon" is used to describe the gate material above photodiode junctions. Poly silicon, for purposes of describing the invention, may indicate a polycrystalline silicon layer, or it may indicate another material used as a gate electrode. Such other material may include a metal silicide or metal, or other such material known to those skilled in the art.

Figure 5:
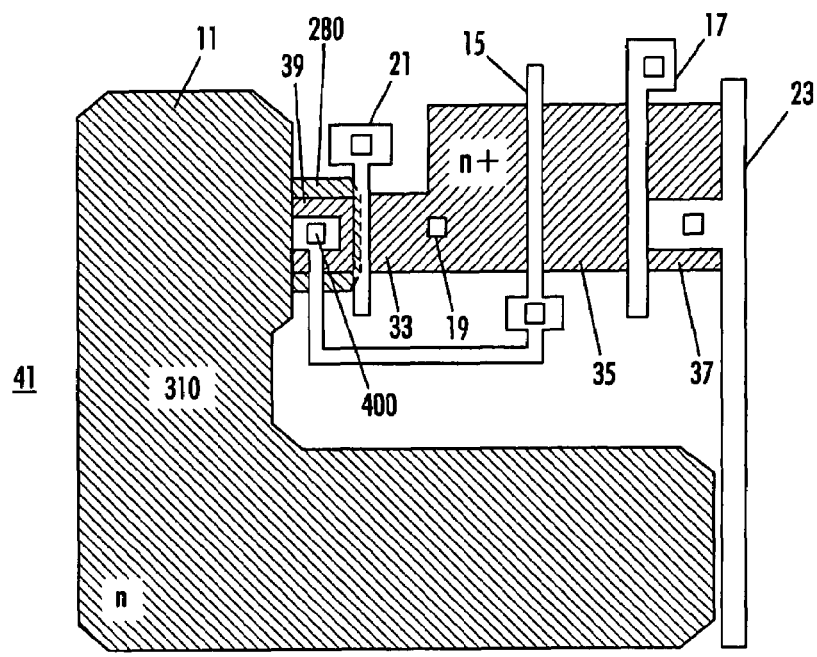
FIG. 5 is one embodiment of a CMOS fabrication process layout for a pixel according to the concepts of the present invention.

A first embodiment of a CMOS fabrication process layout for a pixel according to the concepts of the present invention is illustrated in FIG. 5. As illustrated in FIG. 5, an n-type area 310, defining a photodiode region 11, is provided for forming a P-N junction with a p-type substrate 41. This n-well region 310 can be formed by doping the region simultaneously with the doping step employed to produce n-wells in the substrate for fabricating PMOS circuits and thus no additional fabrication steps need to be added to a standard CMOS fabrication process. The n-well region 310 is also electrically connected to a CMOS readout circuit (not shown).

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

The source and drain regions 33, 35, 37, and 39 of the transistors (21, 15, and 17) are doped n+ in a conventional manner. The n+ source region 39 of the reset transistor 21 is configured to electrically contact the photodiode 11 by being located contiguously with the n-well region 310.

Figure 2:
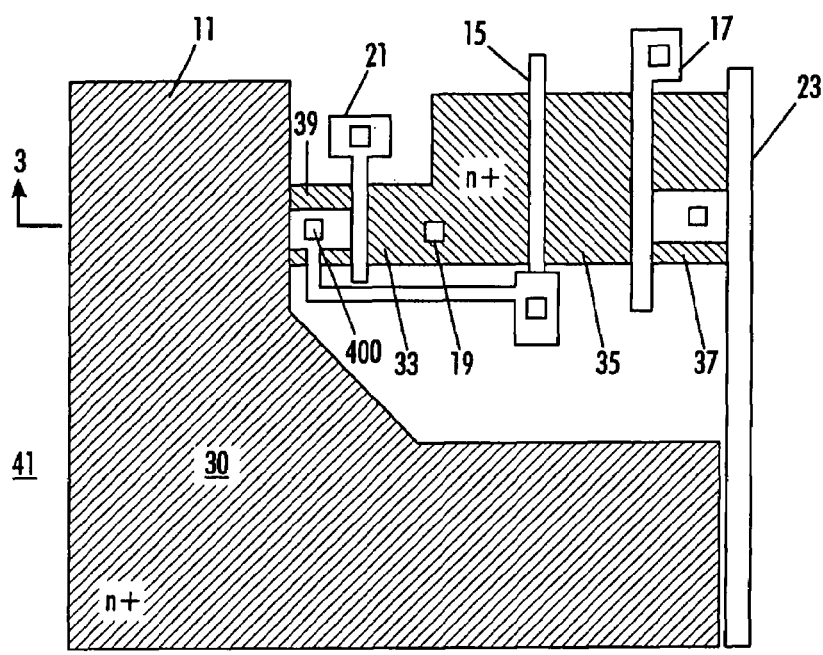
FIG. 2 is a conventional CMOS fabrication process layout for the pixel of FIG. 1.

However, unlike the conventional layout of the photodiode 11 as illustrated in FIG. 2, the photodiode area 310 is extended out, as represented by portion 280 in FIG. 5, to substantially surround the n+ source region 39 of the reset transistor 21 and to also extend partially under the gate of reset transistor 21. By substantially surrounding the n+ source region 39 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

As noted above, the oxide layer which overlays all these regions is thinner at regions of concentrated dopant, such as the n+ dopant source region 39, thereby forming a step in the oxide layer when the oxide layer transitions from region of relatively low dopant concentration to a region having a higher concentration of dopant. This step may cause material defects, such as crystal dislocations, which generate unwanted leakage current when the dislocations are at locations that fall within the depletion region.

By forming a tub region from the n-well photodiode area 310 around the n+ dopant source region 39, the present invention is able to isolate the formation of the crystal dislocations in an area of the substrate that is not associated with the depletion region of the n-well photodiode area 310 and the substrate.

In other words, the oxide layer of FIG. 5 has a varying height such that a height of the oxide layer associated with the well region of the photodiode 310 is thicker than a height of the oxide layer associated with the terminal 39. The oxide layer includes a step region wherein the step region is formed where the height of the oxide layer transitions from the height associated with the photodiode well region 310 to the height associated with the terminal 39. The oxide layer has a constant height across a perimeter of the well region of the photodiode 310 that forms a depletion region with the substrate 41 when a reverse bias voltage is applied across the substrate layer 41 and the well region of the photodiode 310.

Another feature of the present invention as illustrated in FIG. 5, is the shape of the n-well photodiode area 310. As illustrated in FIG. 5, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

It is noted that FIG. 5 is an example of where n+ dopant source region 39, a terminal of the reset transistor 21, is formed contiguously with or immediate adjacent to provide an electrical connection with the photodiode 11. In this embodiment, the photodiode n-well region 310 includes the extended portion 280 so that the step associated with the n+ dopant source region 39 is not associated with the depletion region of the n-well photodiode area 310 and the substrate. This extended portion 280 can be formed by doping the region simultaneously with the doping step employed to produce n-wells in the substrate for fabricating PMOS circuits and thus no additional fabrication steps need to be added to a standard CMOS fabrication process.

Figure 6:
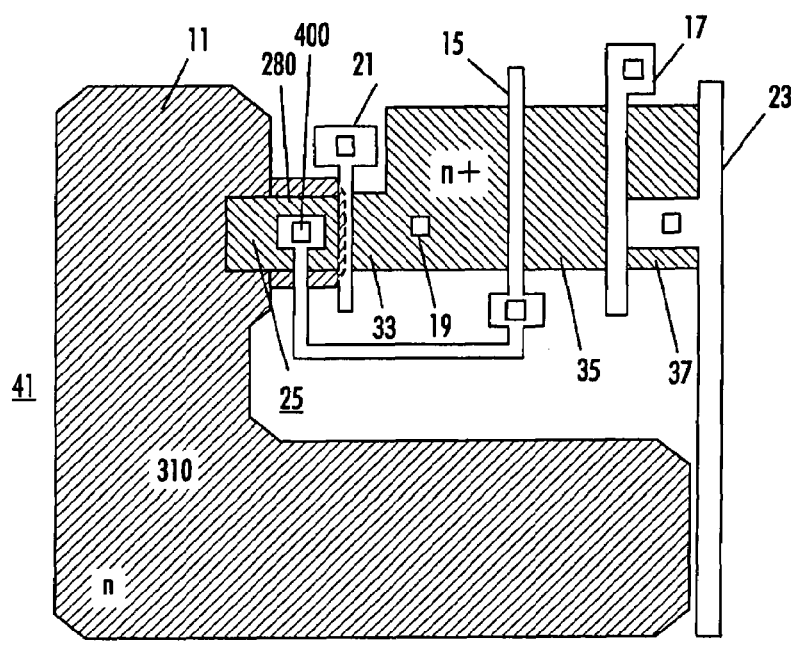
FIG. 6 is a second embodiment of a CMOS fabrication process layout for a pixel according to the concepts of the present invention.

Another embodiment of a CMOS fabrication process layout for a pixel according to the concepts of the present invention is illustrated in FIG. 6. As illustrated in FIG. 6, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

The source and drain regions 25, 33, 35, and 37 of the transistors (21, 15, and 17) are doped n+ in a conventional manner. The n+ source region 25 of the reset transistor 21 is configured to electrically contact the photodiode 11 by extending a portion of the source region 25 into the n-well photodiode area 310.

Figure 4:
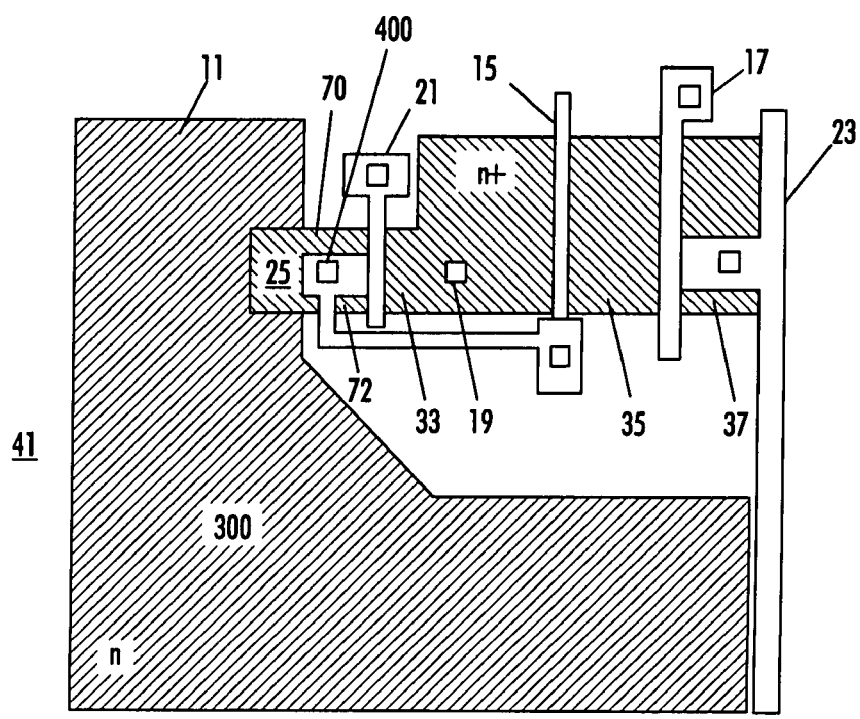
FIG. 4 another conventional CMOS fabrication process layout.

However, unlike the conventional layout of the photodiode 11 as illustrated in FIG. 4, the photodiode area 310 is extended out, as represented by portion 280 in FIG. 6, to substantially surround the n+ source region 25 of the reset transistor 21 and to also extend partially under the gate of reset transistor 21. By substantially surrounding the n+ source region 25 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

As noted above, the oxide layer which overlays all these regions is thinner at regions of concentrated dopant, such as the n+ dopant source region 25, thereby forming a step in the oxide layer when the oxide layer transitions from region of relatively low dopant concentration to a region having a higher concentration of dopant. This step may cause material defects, such as crystal dislocations, which generate unwanted leakage current when the dislocations are at locations within the depletion region.

By forming a tub region from the n-well photodiode area 310 around the n+ dopant source region 25, the present invention is able to isolate the formation of the crystal dislocations in an area of the substrate that is not associated with the depletion region of the n-well photodiode area 310 and the substrate.

In other words, the oxide layer of FIG. 6 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

Another feature of the present invention as illustrated in FIG. 6, is the shape of the n-well photodiode area 310. As illustrated in FIG. 6, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

It is noted that FIG. 6 is an example of where n+ dopant source region 25, a terminal of the reset transistor 21, is formed partially within the photodiode 11 to provide an electrical connection with the photodiode 11. In this embodiment, the photodiode n-well region 310 also includes the extended portion 280 so that the step associated with the n+ dopant source region 25 is not associated with the depletion region of the n-well photodiode area 310 and the substrate. This extended portion 280 can be formed by doping the region simultaneously with the doping step employed to produce n-wells in the substrate for fabricating PMOS circuits and thus no additional fabrication steps need to be added to a standard CMOS fabrication process.

Figure 7:
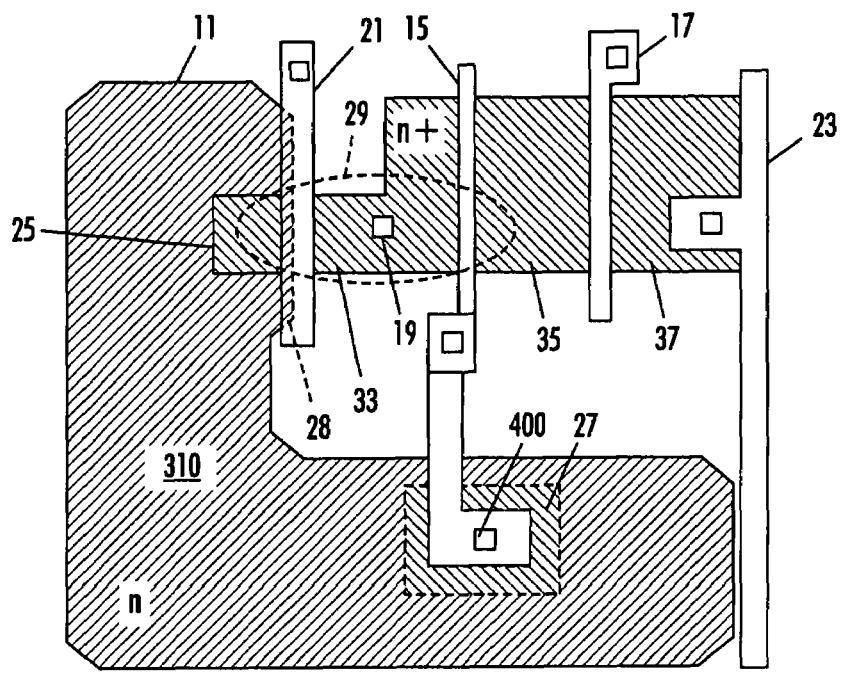
FIG. 7 is a third embodiment of a CMOS fabrication process layout for a pixel according to the concepts of the present invention.

A further embodiment of a CMOS fabrication process layout for a pixel according to the concepts of the present invention is illustrated in FIG. 7. As illustrated in FIG. 7, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

In this embodiment, an n+ source region 25 is located within the photodiode region 11 such that a portion of the outer perimeter or boundary of the photodiode region 11, represented by the dashed line 28 in FIG. 7, actually extends partially under the gate of reset transistor 21. The boundary or perimeter region of the photodiode 11 has a continuous oxide layer thickness thereupon with no step across the boundary or perimeter region of the photodiode 11. Thus, the corresponding depletion region in FIG. 7 has substantially reduced material defects therein, such as crystal dislocations, which can be electron-hole generation centers and generate unwanted leakage current.

The source and drain regions 33, 35, and 37 of the transistors (21, 15, and 17) are doped n+ in a conventional manner. The source and drain region 33 includes a contact 19 to provide a connection to voltage $V_{DD}$.

The n+ source region 25 of the reset transistor 21 is configured to contact the photodiode 11 by forming the source region 25 within the n-well photodiode area 310, as a shallow n+ well in the relatively deeper n-well region 310. By locating the source region 25 within the n-well photodiode area 310, the portion 28 of the n-well photodiode area 310 extends partially under a portion of the gate of the reset transistor 21, thereby effectively surrounding the n+ dopant source region 25 by a deeper n-well region. This deeper n-well region forms a tub region around the n+ dopant source region 25.

As noted above, the oxide layer which overlays all these regions is thinner at regions of concentrated dopant, such as the n+ dopant source region 25, thereby forming a step in the oxide layer when the oxide layer transitions from region of relatively low dopant concentration to a region having a higher concentration of dopant. This step causes material defects, such as crystal dislocations, which generate unwanted leakage current when the dislocations are formed in the depletion region.

In other words, the oxide layer of FIG. 7 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

Figure 8:
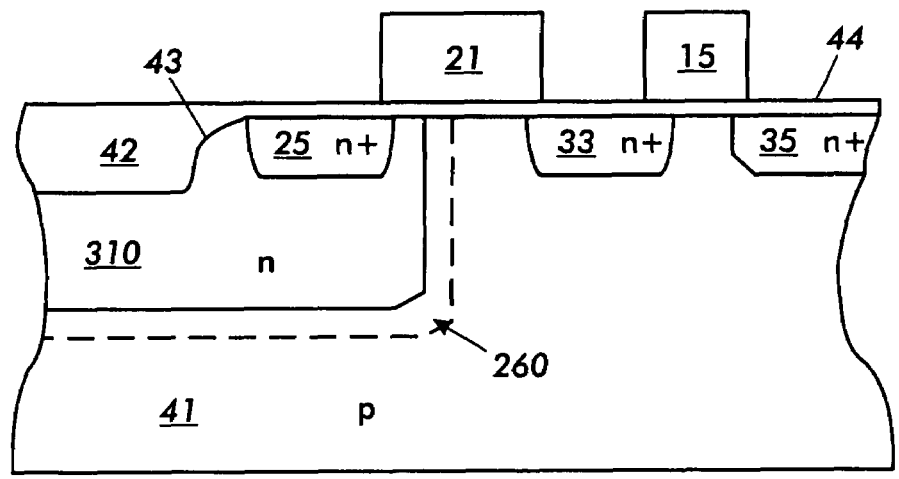
FIG. 8 is a cross-sectional view of the CMOS fabrication process layout taken at the section 29 of FIG. 7.

By forming a tub region from the n-well photodiode area 310 around the n+ dopant source region 25, the present invention is able to isolate the formation of the crystal dislocations in an area of the substrate that is not associated with the depletion region of the n-well photodiode area 310 and the substrate. FIG. 8 illustrates this isolation feature in more detail.

It is noted that FIG. 8 illustrates the situation when the reset transistor 21 is OFF and the photodiode region 310 is accumulating charge therein. When the reset transistor 21 is ON, there is no depletion region due to the voltage bias generated by the reset transistor 21.

As illustrated in FIG. 8, the depletion region 260 between the n-well photodiode area 310 and the p-type substrate 41 is at an effective distance away from the step 43 between the oxide layer regions 42 (thick layer) and 44 (thin layer). With this arrangement, the location of the depletion region 260 is located effectively away from the crystal dislocation region associated with step 43, and therefore, the dislocations cannot generate leakage current. In other words, when the height or thickness of the oxide layer across a depletion region is not constant, dislocations are formed which cause leakage current to be generated. The present invention, as illustrated in FIG. 8, provides for the height or thickness of the oxide layer to be constant across a depletion region so as to effectively or substantially reduce dislocations and the associated leakage current.

Figure 3:
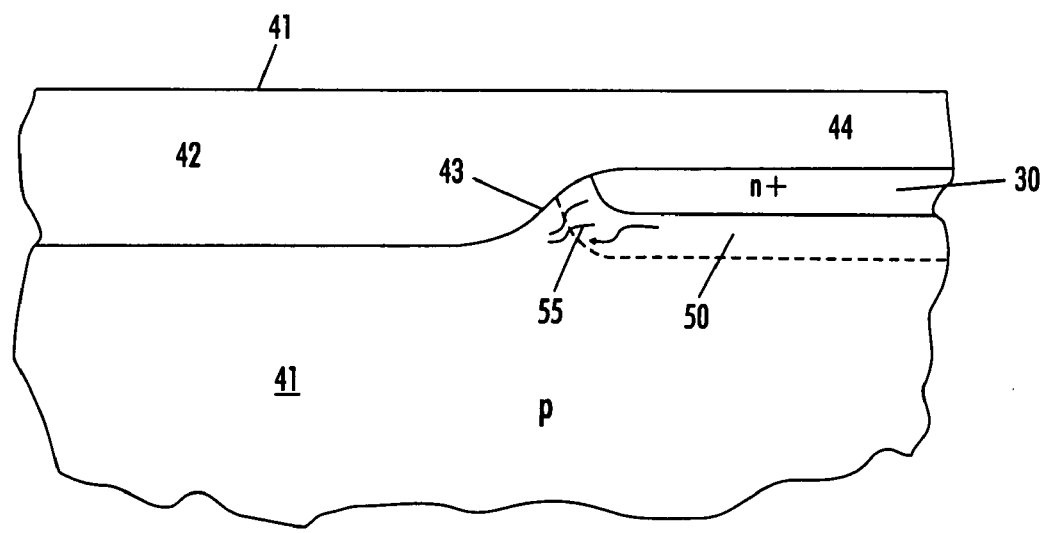
FIG. 3 is a cross-sectional view of the conventional CMOS fabrication process layout taken at the section 3 of FIG. 2.

As noted above, the oxide step 43 does not cause effective current leakage or defective pixels. The diffusion of the n-well photodiode area 310 is relatively deep, e.g., about 1 µm. As a result, the surface P-N junction and depletion region 260 formed with the p-type substrate 41 at the horizontal side of the n-well photodiode area 310 are not located (in the same manner as illustrated in FIG. 3) at the oxide step 43. Crystal dislocations formed at the substrate surface in the area of the oxide step 43 cannot, in general, extend to the surface P-N junction and corresponding depletion region 260 resulting from the use of the n-well photodiode area 310 according to the concepts of the present invention.

Moreover, the P-N junction and depletion region 260 formed with the p-type substrate 41 at the vertical bottom of the n-well photodiode area 310 are far below the substrate surface at the location of the oxide step 43. Crystal dislocations formed at the substrate surface in the area of the oxide step 43 cannot, in general, extend to the deeper P-N junction and corresponding depletion region 260 resulting from the use of the n-well photodiode area 310 according to the concepts of the present invention.

Thus, as illustrated in FIG. 8, the crystal dislocations associated with oxide step 43 are formed at a location that is substantially too far from the P-N junction and depletion region 260 for effective leakage current to be generated.

The thin-thick oxide step 43 around the n+ dopant source region 25 is within the n-well photodiode area 310, away from the perimeter of the n-well photodiode area 310, and therefore is away from locations at which the depletion region 260 between the n-well photodiode area 310 and the p-type substrate 41 are near to the substrate surface. As a result, the n+ dopant source region 25 doping produces no effective dislocation-induced leakage current.

In summary, there is no oxide step across the boundary between the p-type substrate 41 and the n-well photodiode area 310 and thus stress-induced dislocations are substantially reduced in the surface of the substrate at the location of the depletion region between the photodiode well 310 and the substrate 41. The boundary of the n+ dopant source region 25 with the gate of the reset transistor 21 likewise has no oxide step because the n+ source diffusion results in a thin gate oxide rather than thick oxide. Thus, at every point around the perimeter of the n-well photodiode area 310, including that section of perimeter associated with, i.e., near to, the n+ dopant source region 25, the overlaying oxide layer thickness is substantially constant, moving across the boundary of the perimeter, thereby effectively eliminating any oxide step across the boundary that could induce dislocations in the substrate.

As explained above, the photodiode area 310 adjacent to the gate of the reset transistor 21 can result in an n-well region that extends partially under the gate area of the reset transistor 21, thereby effectively shortening the channel of the transistor. If this is a concern for a given application, it can be preferred, as shown in FIGS. 7 through 10, to provide a gate of a length larger than that conventionally employed. This larger gate length can compensate for the n-well region extent into the gate region such that the transistor channel is maintained at a specified minimum length or greater. The larger gate length can also effectively compensate for the misalignment between the n-well and the gate area.

Another feature of the present invention as illustrated in FIG. 7, is the shape of the n-well photodiode area 310. As illustrated in FIG. 7, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, the possibility of increased leakage current, are produced. Preferably, the corners of the n-well photodiode area 310 are obtuse angles.

It is noted that FIG. 7 is an example of where n+ dopant source region 25, a terminal of the reset transistor 21, is formed within the photodiode 11 so that an electrical connection is provided between the photodiode 11 and the n+ dopant source region 25, and the step associated with the n+ dopant source region 25 is not associated with the depletion region of the n-well photodiode area 310 and the substrate 41.

As also illustrated in FIG. 7, according to the concepts of the present invention, the pixel's sense node contact 400 is provided in the n-well photodiode area 310. Thus, the n-well photodiode area 310 is itself the sense node region, together with the reset transistor source 25.

Figure 9:
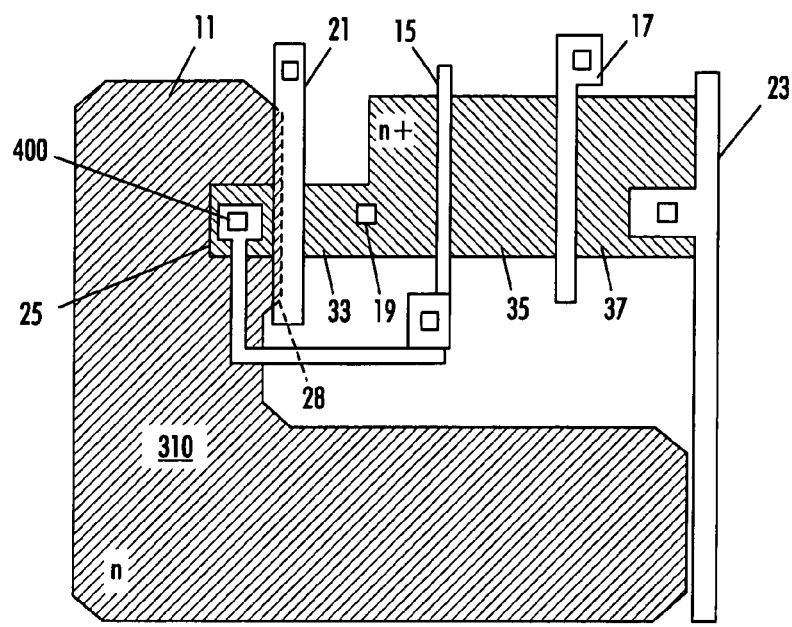
FIG. 9 is another embodiment of a CMOS fabrication process layout for a pixel according to the concepts of the present invention.

In accordance with the present invention, the contact 400 between the gate of the source follower transistor 15 and the sense node can be made at any point in the n-well photodiode area 310, either within the reset transistor source region 25, as illustrated in FIG. 9, or the n-well photodiode area 310, as illustrated in FIG. 7.

As illustrated in FIG. 7, according to the concepts of the present invention, the sense node contact 400 is not located at the perimeter or boundary of the photodiode area 310, but instead, the sense node contact 400 is located at some point away from the perimeter of the photodiode area 310. In order to ensure sufficient ohmic contact between the metal of the sense node contact 400 and the photodiode area 310, it is preferred that an n+ region 27 be provided surrounding the sense node contact 400. This n+ region 27 would preferably extend under and beyond sense node contact 400. While not required, the n+ region 27 can be preferred for most applications.

The n+ region 27 can be formed simultaneously with the source and drain regions (25, 33, 35, and 37) of the pixel transistors and thus no additional fabrication steps need to be added to a standard CMOS fabrication process.

Given that n+ region 27 doping is carried out simultaneously with the n+ transistor source and drain doping, the n+ region 27 is covered by the thin gate oxide rather than the thick field oxide. However, similar to the situation described above with respect to FIG. 8, the surrounding photodiode area 310 is covered with the thick field oxide. As a result, a thin-thick oxide step exists along the perimeter of the n+ region 27 inside the n-well photodiode area 310.

As noted above, the oxide step associated with the n+ region 27 does not cause effective current leakage or defective pixels. The diffusion of the n-well photodiode area 310 is relatively deep, e.g., about 1 μm. As a result, the P-N junction and depletion region formed with the p-type substrate 41 at the horizontal side of the n-well photodiode area 310 are not located at the oxide step associated with the n+ region 27. Crystal dislocations formed at the substrate surface in the area of the oxide step associated with the n+ region 27 cannot, in general, extend to the surface P-N junction and corresponding depletion region resulting from the use of the n-well photodiode area 310 according to the concepts of the present invention.

Moreover, the P-N junction and depletion region formed with the p-type substrate 41 at the vertical bottom of the n-well photodiode area 310 are far below the substrate surface at the location of the oxide step associated with the n+ region 27. Crystal dislocations formed at the substrate surface in the area of the oxide step associated with the n+ region 27 cannot, in general, extend to the deeper P-N junction and corresponding depletion region resulting from the use of the n-well photodiode area 310 according to the concepts of the present invention.

Thus, the crystal dislocations associated with oxide step associated with the n+ region 27 of FIG. 7 are formed at a location that is substantially too far from the P-N junction and depletion region for effective leakage current to be generated.

In the embodiment illustrated by FIG. 7, the dopant-concentrated region 27 is positioned within the doped well region 310 such that the doped well region 310 completely surrounds the dopant-concentrated region 27, and any oxide-layer transition regions causing stress-induced dislocations are not located at the depletion region 260 formed around the perimeter of the doped well region 310. In other words, any oxide-layer transition regions causing stress-induced dislocations are located in an area that is outside the depletion region formed around the perimeter of the doped well region 310.

As illustrated in FIG. 9, according to the concepts of the present invention, the sense node contact 400 is not located at the perimeter or boundary of the photodiode area 310, but instead, the sense node contact 400 is located in the reset transistor source region 25.

In the same manner as described above with respect to FIG. 7, the reset transistor source region 25 of FIG. 9 is located within the photodiode 11 such that a portion 28 of the photodiode area 310 is extended partially under the gate of the reset transistor 21 so as to substantially surround the reset transistor source region 25 in a deep well region. The photodiode area 310 is covered with the thick field oxide. As a result, a thin-thick oxide step exists along one perimeter of reset transistor source region 25 inside the n-well photodiode area 310.

As noted above, the oxide step associated with the reset transistor source region 25 of FIG. 9 does not cause effective current leakage or defective pixels. The diffusion of the n-well photodiode area 310 is relatively deep, e.g., about 1 μm. As a result, the P-N junction and depletion region formed with the p-type substrate 41 at the vertical bottom of the n-well photodiode area 310 are far below the substrate surface at the location of the oxide step associated with the reset transistor source region 25. These crystal dislocations formed at the substrate surface in the area of the oxide step associated with the reset transistor source region 25 cannot, in general, extend to the deeper P-N junction resulting from the use of the n-well photodiode area 310 according to the concepts of the present invention.

Also, the thin-thick oxide step associated with the reset transistor source region 25 of FIG. 9 is within the n-well photodiode area 310, away from the perimeter of the n-well photodiode area 310, and therefore is away from locations at which the P-N junction and depletion region between the n-well photodiode area 310 and the p-type substrate 41 are near to the substrate surface. As a result, the reset transistor source region 25 doping produces no effective dislocation-induced leakage current.

In other words, the oxide layer of FIG. 9 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

In this embodiment, the dopant-concentrated region 25 is positioned within the doped well region 310 such that the doped well region 310 completely surrounds the dopant-concentrated region 25 and a portion of the doped well region 310 extends partially under the gate of the reset transistor 21, thereby any transition regions causing stress-induced dislocations in the oxide layer are not located at the depletion region formed around the perimeter of the doped well region 310. In other words, the transition regions causing stress-induced dislocations in the oxide layer are located in an area that is outside the depletion region formed around the perimeter of the doped well region 310.

With respect to FIGS. 7 and 9, in accordance with the concepts of the present invention, the source and drain geometries of the various pixel transistors can be tailored to meet the performance specifications for each transistor. For example, the source and drain regions can be made wider for the source-follower transistor 15 and row select transistor 17, to enable higher driving capabilities of the transistors.

As illustrated in FIGS. 7 and 9, with respect to the boundaries of the other n+ source/drain regions (33, 35, and 37) with the substrate, these boundaries have oxide steps associated therewith, but the current produced therefrom is not a problem. It is only the current produced at regions having the same dopant type and the same electrical potential as the photodiode that is the problem.

It is noted that FIG. 9 is another example of where n+ dopant source region 25, a terminal of the reset transistor 21, is formed within the photodiode 11 so that an electrical connection is provided between the photodiode 11 and the n+ dopant source region 25, and the step associated with the n+ dopant source region 25 is not associated with the depletion region of the n-well photodiode area 310 and the substrate.

Another feature of the present invention as illustrated in FIG. 9, is the shape of the n-well photodiode area 310. As illustrated in FIG. 9, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

Figure 10:
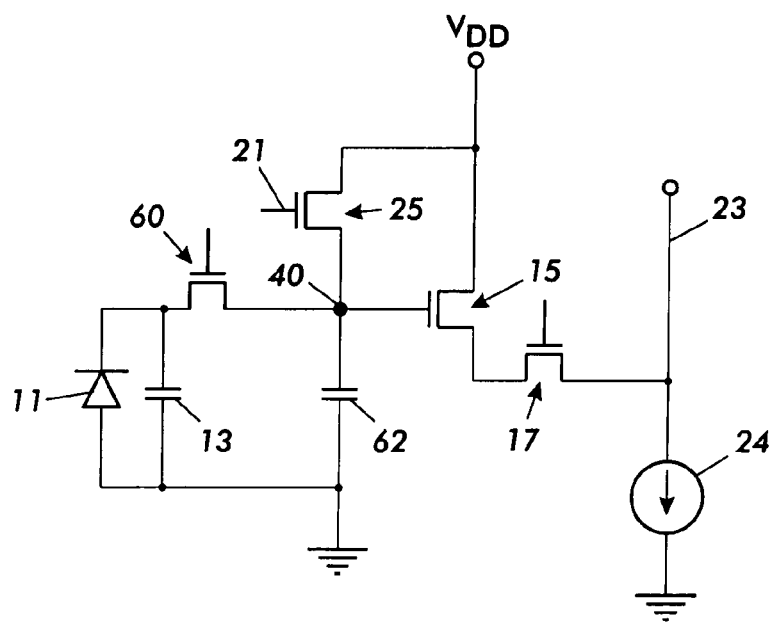
FIG. 10 a conventional circuit diagram of a CMOS pixel with a cascode transistor.

FIG. 10 illustrates an additional pixel circuit example addressed by the layout design of the present invention. In this configuration, a cascode transistor 60 is provided between the pixel photodiode 11 and the reset transistor 21. This cascode transistor 60 acts to further reduce the sense capacitance of the pixel, thereby increasing the sensitivity of the pixel. The sense node 40 of the pixel is in this design not at the photodiode 11 but instead at the junction between the output of the cascode transistor 60 and the source of the reset transistor 21. A parasitic capacitance 62 associated with the sense node 40 is represented in the pixel design as a capacitor element in the manner of the photodiode parasitic capacitance 13. The source follower transistor 15 and row select transistor 17 operate in the manner of the pixel design of FIG. 1.

Figure 11:
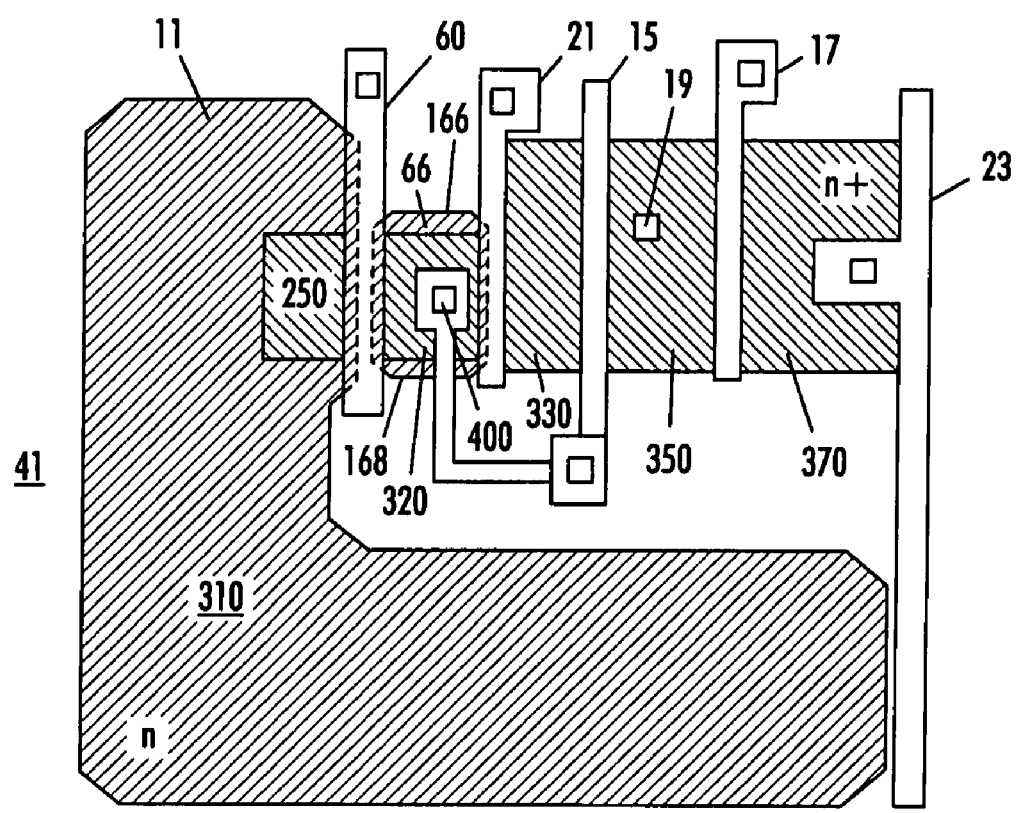
FIG. 11 is an embodiment of a CMOS fabrication process layout for the CMOS pixel of FIG. 10 according to the concepts of the present invention
Figure 12:
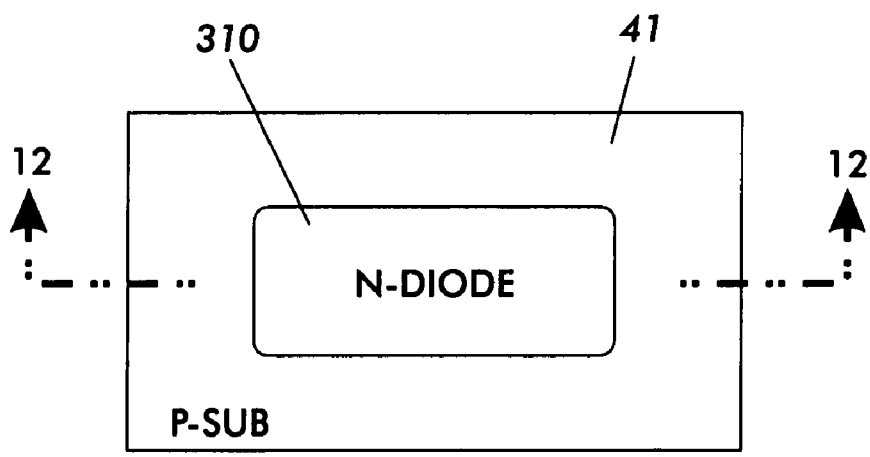
FIG. 12 shows a top view of a p-n junction diode.
Figure 13:
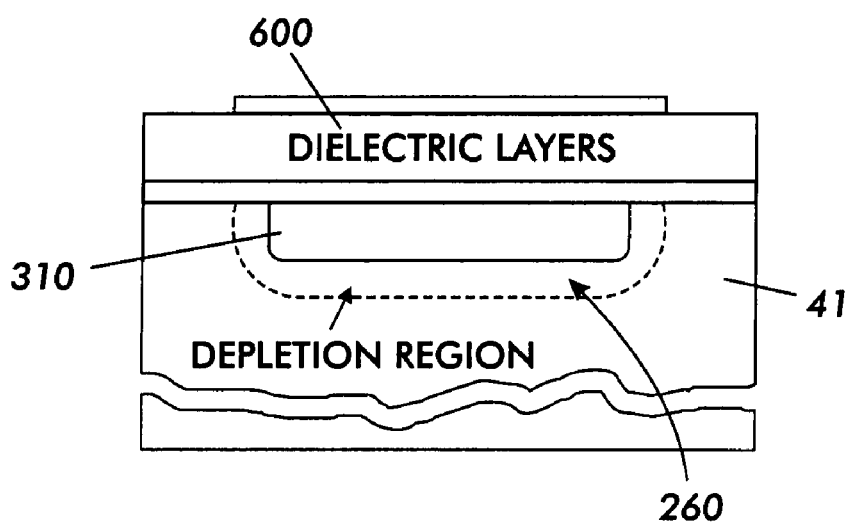
FIG. 13 shows the cross-section of the p-n junction diode of FIG. 12.

FIG. 11 illustrates a layout for the CMOS pixel of FIG. 10 according to the concepts of the present invention. Like the pixel layouts of FIGS. 7 and 9, the pixel layout of FIG. 11 employs an n-well photodiode area 310. The source 250 of the cascode transistor 60 is formed by an n+ shallow diffusion within the n-well photodiode area 310. As with FIGS. 7 and 9, the source 250 of the cascode transistor 60 is located such that a portion of the n-well photodiode area 310 substantially surrounds the source 250 and partially extends under a portion of the gate of the cascode transistor 60. As a result, a thin-thick oxide step exists along one perimeter of reset transistor source region 250 inside the n-well photodiode area 310.

As noted above, the oxide step associated with the source region 250 does not cause effective current leakage or defective pixels. The diffusion of the n-well photodiode area 310 is relatively deep, e.g., about 1 μm. As a result, the P-N junction and depletion region formed with the p-type substrate 41 at the vertical bottom of the n-well photodiode area 310 are far below the substrate surface at the location of the oxide step associated with the source region 250. These crystal dislocations formed at the substrate surface in the area of the oxide step associated with the source region 250 cannot, in general, extend to the deeper P-N junction resulting from the use of the n-well photodiode area 310 according to the concepts of the present invention.

Also, the thin-thick oxide step associated with the source region 250 is within the n-well photodiode area 310, away from the perimeter of the n-well photodiode area 310, and therefore is away from locations at which the P-N junction and depletion region between the n-well photodiode area 310 and the p-type substrate 41 are near to the substrate surface. As a result, the source region 250 doping produces no effective dislocation-induced leakage current.

This n+ source region 250 is preferably formed simultaneously with the n+ source and drain regions (320, 330, 350, and 370) of the other pixel transistors and thus no additional fabrication steps need to be added to a standard CMOS fabrication process. The source and drain region 350 includes a contact 19 to provide a connection to voltage $V_{DD}$.

A thin gate oxide covers the surface of the substrate at the location of the n+ cascode source 250 in a similar manner to the reset transistor source region 25 as illustrated in FIG. 8. This thin oxide extends across the source boundary to the channel region under the gate of the cascode transistor 60, and therefore is of a constant oxide height in accordance with the concepts of the present invention.

The n-well photodiode area 310 is preferably formed simultaneously with n-wells formed in the substrate for PMOS circuitry and thus no additional fabrication steps need to be added to a standard CMOS fabrication process.

At all sections of the perimeter of the n-well photodiode area 310 other than the region of the cascode source 250, a thick field oxide covers the substrate, and is of constant height across the boundary of the perimeter. Stress-induced substrate dislocations that could produce pixel leakage current are therefore eliminated at these points.

In the manner of the reset source region 25 in the pixel layout of FIG. 8, the cascode transistor source region 250 presents an oxide height step at the boundary of the n+ source diffusion in the n-well photodiode area 310. As explained above, this boundary is not at the perimeter of the n-well photodiode area 310, where the P-N junction and depletion region approaches the substrate surface, and thus, any dislocations at this boundary do not contribute to leakage current.

As illustrated in FIG. 11, the sense node contact 400 is located at the drain/source connection region 320 between the cascode transistor 60 and the reset transistor 21. The drain/source connection region 320 defines the drain of the cascode transistor 60 and the source of the reset transistor 21 and thus is an n+ substrate region in which a thin gate oxide covers the substrate. The edges of the drain/source connection region 320 between the two gates of the transistors 60 and 21 that would normally form the boundary between the drain/source connection region 320 and the field area 41 are bounded by the thick field oxide. As a result, dislocations can form at near-surface substrate locations and contribute leakage current to the pixel signal measured at the sense node contact 400.

In accordance with the concepts of the present invention, this undesirable condition is eliminated by providing an n-type well region 66 around the edges of the drain/source region 320. Preferably, the n-type well region 66 is produced simultaneously with the n-well formation in the substrate and thus no additional fabrication steps need to be added to a standard CMOS fabrication process. As a result, a thin-thick oxide step exists along one perimeter of reset transistor source region 320 inside the n-well region 66.

As noted above, the oxide step associated with the source region 320 does not cause effective current leakage or defective pixels. The diffusion of the n-well region 66 is relatively deep, e.g., about 1 µm. As a result, the P-N junction and depletion region formed with the p-type substrate 41 at the vertical bottom of the n-well region 66 are far below the substrate surface at the location of the oxide step associated with the source region 320. These crystal dislocations formed at the substrate surface in the area of the oxide step associated with the source region 320 cannot, in general, extend to the deeper P-N junction resulting from the use of the n-well region 66 according to the concepts of the present invention.

Also, the thin-thick oxide step associated with the source region 320 is within the n-well region 66, away from the perimeter of the n-well region 66, and therefore is away from locations at which the P-N junction and depletion region between the n-well region 66 and the p-type substrate 41 are near to the substrate surface. As a result, the source region 320 doping produces no effective dislocation-induced leakage current.

In other words, the oxide layer of FIG. 11 has a varying height such that a height of the oxide layer associated with the well region of the photodiode 310 is thicker than a height of the oxide layer associated with the terminals 250 and 320. The oxide layer includes a step region wherein the step region is formed where the height of the oxide layer transitions from the height associated with either the photodiode well region 310 or terminal well region 66 to the height associated with the terminals 250 and 320. The oxide layer has a constant height across perimeters of the well regions 310 and 66 that form depletion regions with the substrate 41 when a reverse bias voltage is applied across the substrate layer 41 and the well regions 310 and 66.

The n+ source/drain region 320 can be provided in the conventional manner with the other source and drain regions and thus no additional fabrication steps need to be added to a standard CMOS fabrication process. With this configuration, the n+ source/drain region 320, having a thin oxide overlayer, extends only within the n-type region 66 having a thick field oxide. As a result, a step in oxide height from the thin gate oxide to the thicker field oxide occurs within the n-type well region 66. Across the boundaries 166 and 168 of the n-type well region 66, the oxide height is constant, at the field oxide thickness. Stress-induced dislocations are therefore not produced at the P-N junction formed with the substrate at the boundary of the edge regions 166 and 168, and in turn, dislocation-induced leakage current is not generated at these locations.

In the embodiment illustrated in FIG. 11, the dopant-concentrated source region 250 is positioned within the doped well region 310 such that the doped well region 310 completely surrounds the dopant-concentrated source region 250, and any transition regions causing stress-induced dislocations in the oxide layer are not located at the depletion region formed around the perimeter of the doped well region 310. In other words, the transition regions causing stress-induced dislocations in the oxide layer are located in an area that is outside the depletion region formed around the perimeter of the doped well region 310.

With respect to the boundaries of the other n+ source/drain region (330, 350, and 370) with the substrate, these boundaries have oxide steps associated therewith, but the current produced therefrom is not a problem. It is only the current produced at regions having the same electrical potential as the photodiode that is the problem.

It is noted that FIG. 11 is a further example of where n+ dopant source region 250, a terminal of the cascode transistor 60, is formed within the photodiode 11 so that an electrical connection is provided between the photodiode 11 and the n+ dopant source region 250, and the step associated with the n+ dopant source region 250 is not associated with the depletion region of the n-well photodiode area 310 and the substrate.

Another feature of the present invention as illustrated in FIG. 11, is the shape of the n-well photodiode area 310 and the n-type well region 66. As illustrated in FIG. 11, the n-well photodiode area 310 and the n-type well region 66 have no right angles included in their geometry. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 and the n-type well region 66 are obtuse angles.

As noted above, a typical mechanism for leakage current generation is the defect levels within silicon bandgap, especially inside the depletion region. The defect density determines how fast the dark-current charges can be generated at a specific temperature and the density of defects is strongly related with the processing technology used to build the sensors. Additionally, there could be some fixed charges resides between layer junctions that were introduced during wafer processing (e.g. by plasma processes). The trapped charges could possibly form a depletion region or a weak channel between photodiode junctions along the junction surface and either increase generation current or cause a leakage current path.

To reduce the leakage current due to trapped charges, surface states, or defects cause by damage during processing, the present invention further provides a photo diode sensor structure with a polycrystalline silicon ("poly silicon") region over and surrounding the intersection of the junction of the Nwell-Psub diode with the oxide layer at the surface for leakage current reduction.

Figure 14:
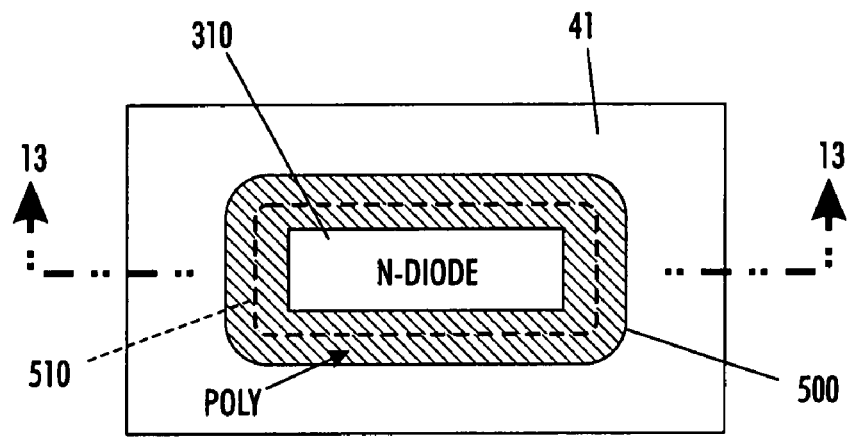
FIG. 14 shows a top view of a p-n junction diode with poly silicon region at a periphery of the diode junction according to the concepts of the present invention.
Figure 15:
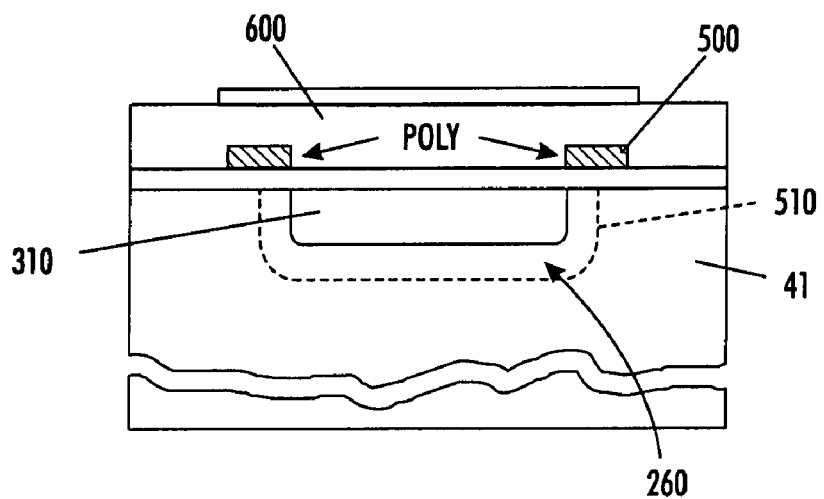
FIG. 15 shows the cross-section of the p-n junction diode of FIG. 14.

FIGS. 14 and 15 show a top view and a cross-section view through line 13-13, respectively, of the photo diode sensor structure with a poly silicon region over and surrounding the junction of the Nwell-Psub diode at the surface for leakage current reduction. In other words, the poly silicon region is formed along the periphery of the diode junction.

As illustrated in FIGS. 14 and 15, a poly silicon region 500 is applied over and surrounding the surface intersection of junction 510 of the Nwell-Psub diode (310, 41); i.e., the poly silicon region 500 is formed along the periphery of the diode junction 510. This poly silicon gate 500 serves two purposes.

First, the poly silicon gate 500 physically shields the p-n junction 510 and prevents any process damage from being introduced after the poly silicon processing (including damages from processes such as dielectric deposition/pattern, metal deposition/pattern and via/contact hole etching).

Secondly, the doped poly-silicon region 500 can be used as an electric shielding electrode to prevent any possible trapped charges at higher levels of dielectric above the junctions to affect the surface potential and form conducting channels between the p-n regions. Thus, leakage current by these mechanisms can be reduced.

Thirdly, the doped poly silicon region 500 can be electrically biased to a potential differing from the potential of either the well or the substrate. This ability to bias the doped poly silicon region allows the surface potentials adjacent to the junction 510 to be set such that surface-induced leakage current is minimized. In a preferred embodiment of the present invention, the doped poly silicon region 500 is electrically biased to a fixed potential. The applied potential is optimized to minimize leakage current.

It is noted that the doped poly silicon regions of adjacent pixels can be tied together so that the gates of adjacent pixel sites have the same bias. Moreover, to save space, this connection between adjacent pixel sites is done in the poly silicon layer (without contacts or metal). The tying of the doped poly silicon regions of adjacent pixels together allows the gate electrical bias to be applied at a periphery of an imaging array, thereby saving space throughout.

A wider poly silicon region 500 is preferred to inhibit the possible leakage mechanisms. However, the optical sensitivity of the image sensor having a wider poly silicon region 500 will be reduced since the doped poly silicon is an excellent optical absorber and reflector. Therefore, the width of the poly silicon gate 500 becomes a trade-off between optical sensitivity and leakage current reduction.

Figure 22:
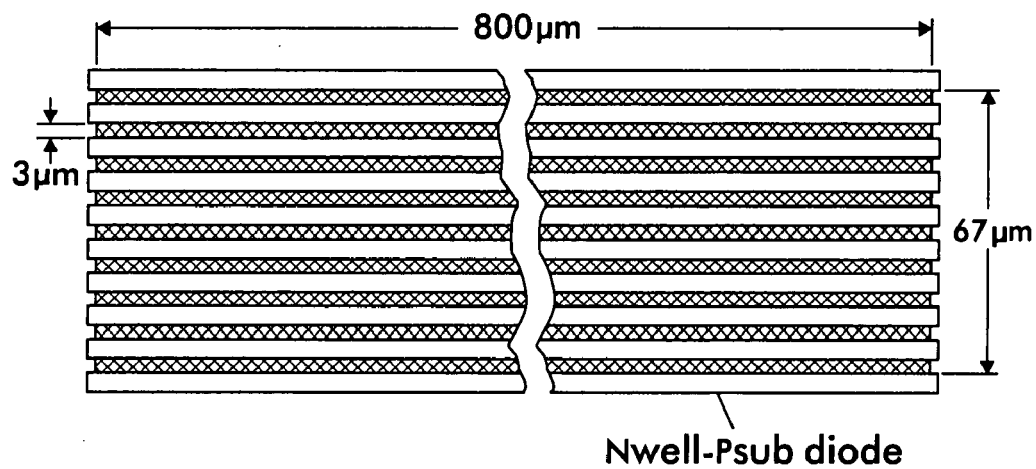
FIG. 22 shows a top view of a typical Nwell-Psub diode.
Figure 23:
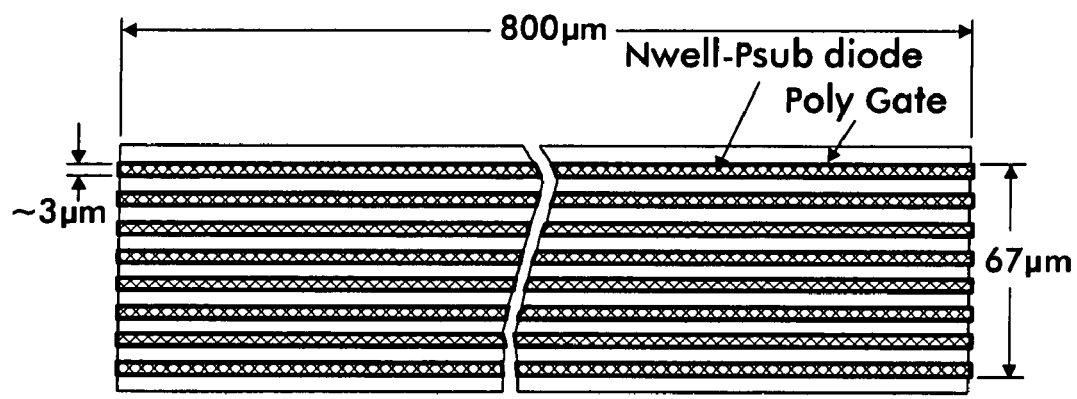
FIG. 23 shows a top view of an Nwell-Psub diode gated with poly silicon region at periphery according to the concepts of the present invention.
Figure 24:
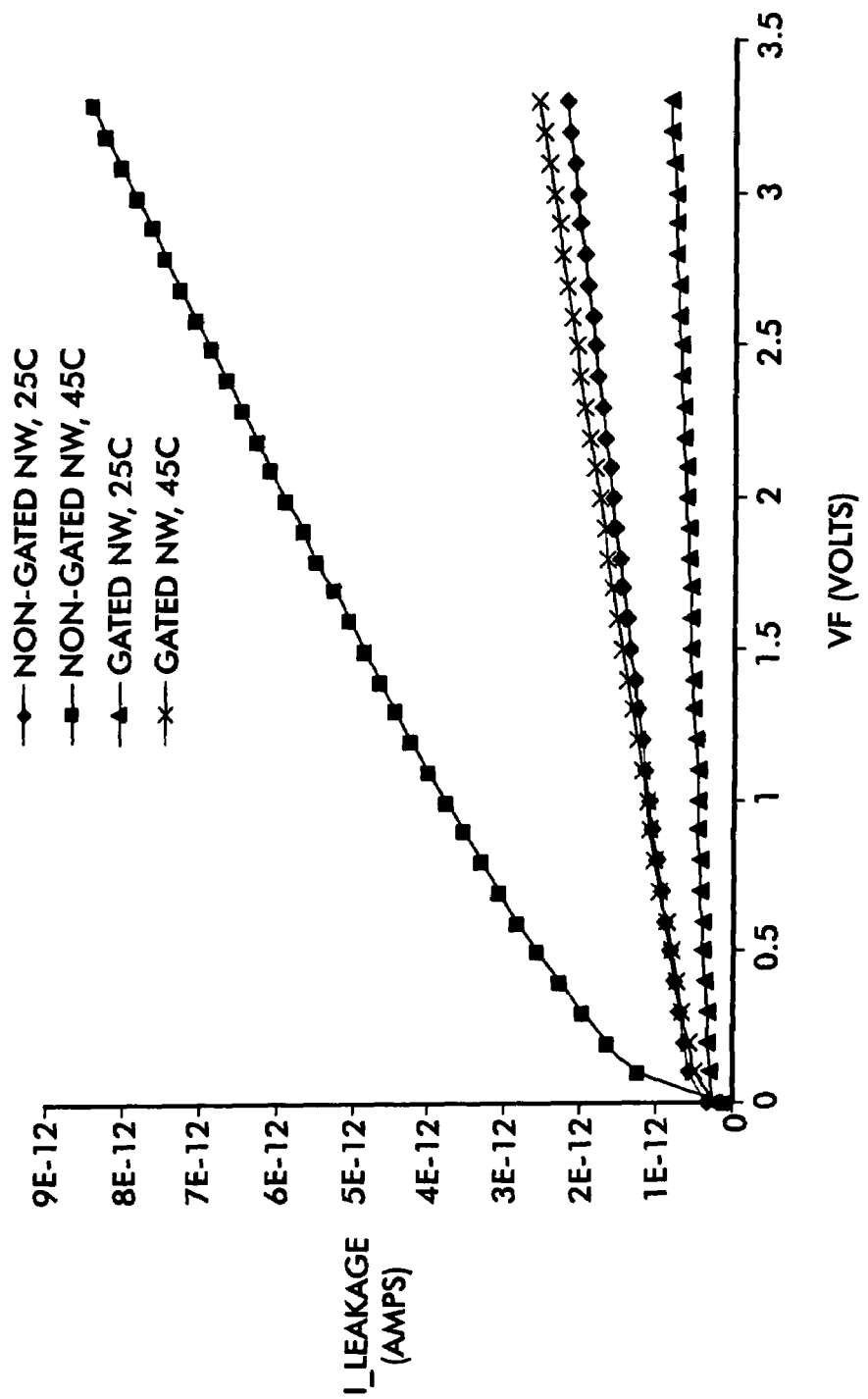
FIG. 24 graphically illustrates leakage current versus forced reverse bias voltage (VF) for the diodes in FIGS. 22 and 23 at 25C and 45C.

FIG. 24 illustrates the comparison of leakage measurement versus applied reverse bias voltage for image sensors having structures corresponding to the illustrations of FIGS. 22 and 23. FIG. 22 illustrates non-gated Nwell-Psub junction diodes, whereas FIG. 23 illustrates gated Nwell-Psub junction diodes according to the concepts of the present invention. The measurements illustrated in FIG. 24 were performed at both 25° C. and 45° C. As seen by FIG. 24, the Nwell-Psub junction diodes of the present invention demonstrated almost three times less leakage current than the non-gated Nwell-Psub junction diodes.

Figure 25:
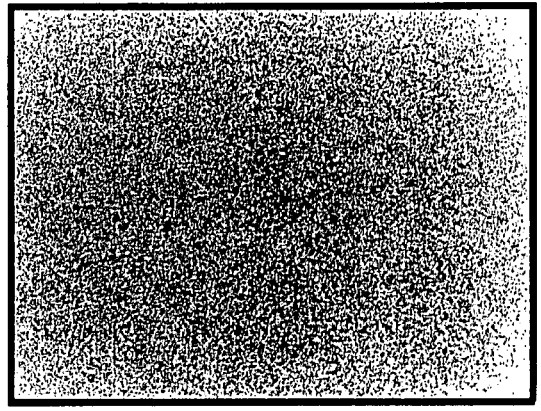
FIG. 25 illustrates a resulting dark image after a long integration time for a typical photodiode sensors.
Figure 26:
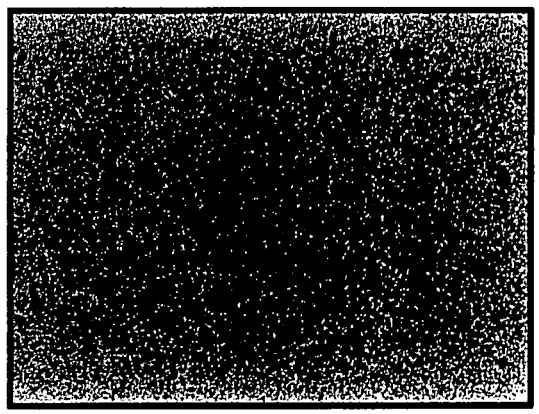
FIG. 26 illustrates a resulting dark image after a long integration time for photodiode sensors gated according to the concepts of the present invention.

FIGS. 25 and 26 illustrate a dark image comparison between non-gated Nwell-Psub junction diodes in a pixel array and gated Nwell-Psub junction diodes according to the concepts of the present invention in a pixel array, respectively. It is noted that for an ideal non-leakage sensor, the image should be black. As seen by FIGS. 25 and 26, there is significant leakage difference between the non-gated Nwell-Psub junction diodes in a pixel array and gated Nwell-Psub junction diodes according to the concepts of the present invention in a pixel array. Thus, FIGS. 25 and 26 empirically show the effectiveness of the gated Nwell-Psub junction diodes according to the concepts of the present invention for leakage current reduction.

Various CMOS fabrication process layouts for a pixel with poly silicon region at a periphery of the diode junction will be described below with respect to FIGS. 16-21.

Figure 16:
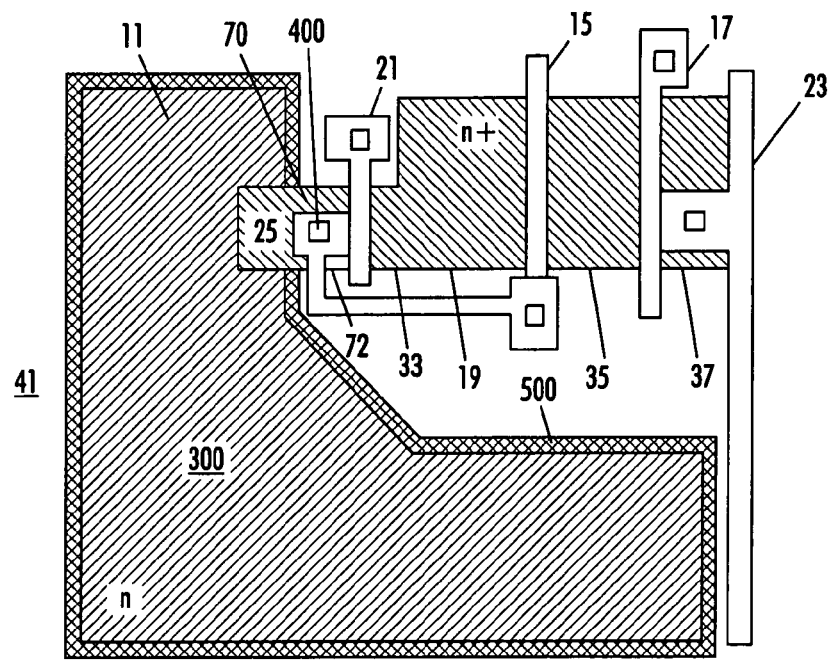
FIG. 16 is one embodiment of a CMOS fabrication process layout for a pixel with poly silicon region at a periphery of the diode junction according to the concepts of the present invention.

FIG. 16 illustrates one embodiment of a CMOS fabrication process layout for a pixel with poly silicon region at a periphery of the diode junction according to the concepts of the present invention. In FIG. 16, the photodiode area 300 is formed simultaneously with the n-type doping of n-wells produced in the substrate for forming PMOS circuits. This n-well formation is a fabrication process step separate from the n+ source and drain formation, in a conventional manner.

In the configuration illustrated in FIG. 16, the sense node contact 400 is provided at the reset transistor source region 25, and the photodiode 11 and the reset transistor source are connected by extending a portion of the reset transistor source region 25 of the transistor 21 into the n-well region 300 of the photodiode 11 by forming an n+ well in the n-well region 300 of the photodiode 11.

The n-well region 300 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 300 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

Figure 17:
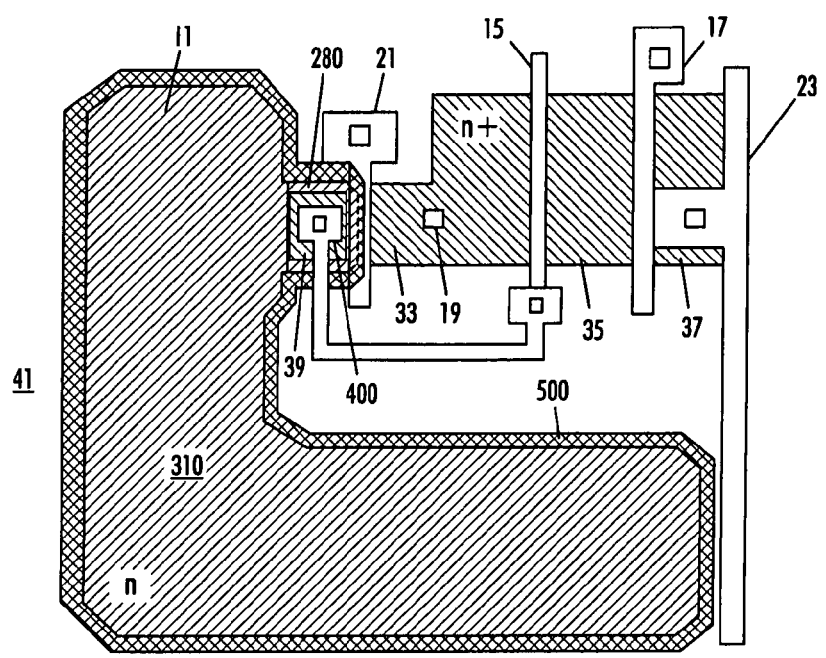
FIG. 17 is another embodiment of a CMOS fabrication process layout for a pixel with poly silicon region at a periphery of the diode junction according to the concepts of the present invention.

Another embodiment of a CMOS fabrication process layout for a pixel according to the concepts of the present invention is illustrated in FIG. 17. As illustrated in FIG. 17, an n-type area 310, defining a photodiode region 11, is provided for forming a P-N junction with a p-type substrate 41. This n-well region 310 can be formed by doping the region simultaneously with the doping step employed to produce n-wells in the substrate for fabricating PMOS circuits and thus no additional fabrication steps need to be added to a standard CMOS fabrication process.

The source and drain regions 33, 35, 37, and 39 of the transistors (21, 15, and 17) are doped n+ in a conventional manner. The n+ source region 39 of the reset transistor 21 is configured to electrically contact the photodiode 11 by being located contiguously with the n-well region 310.

However, unlike the conventional layout of the photodiode 11 as illustrated in FIG. 2, the photodiode area 310 is extended out, as represented by portion 280 in FIG. 17, to substantially surround the n+ source region 39 of the reset transistor 21 and to also extend partially under the gate of reset transistor 21. By substantially surrounding the n+ source region 39 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

As further illustrated by FIG. 17, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

The n-well region 310 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 300 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

Figure 18:
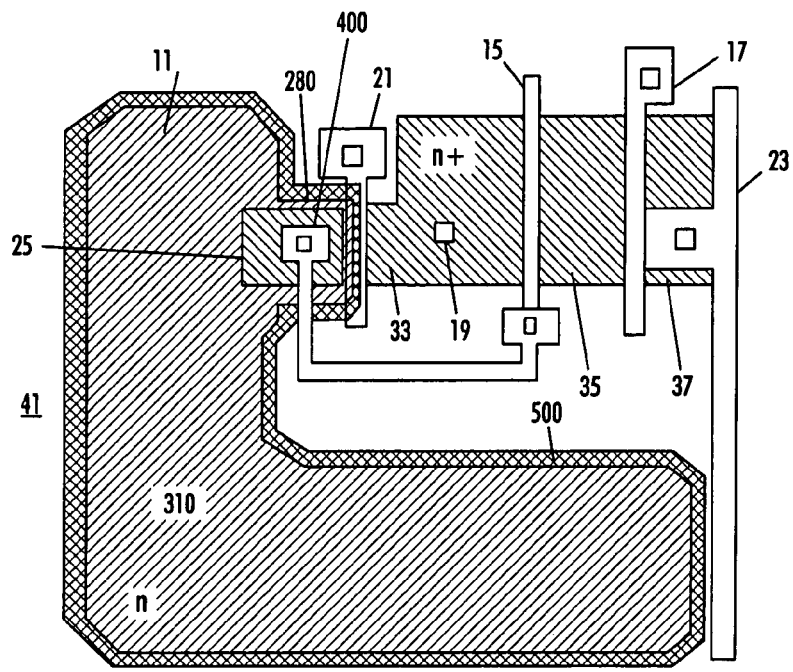
FIG. 18 is a third embodiment of a CMOS fabrication process layout for a pixel with poly silicon region at a periphery of the diode junction according to the concepts of the present invention.

Another embodiment of a CMOS fabrication process layout for a pixel according to the concepts of the present invention is illustrated in FIG. 18. As illustrated in FIG. 18, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

The source and drain regions 25, 33, 35, and 37 of the transistors (21, 15, and 17) are doped n+ in a conventional manner. The n+ source region 25 of the reset transistor 21 is configured to electrically contact the photodiode 11 by extending a portion of the source region 25 into the n-well photodiode area 310.

However, unlike the conventional layout of the photodiode 11 as illustrated in FIG. 4, the photodiode area 310 is extended out, as represented by portion 280 in FIG. 18, to substantially surround the n+ source region 25 of the reset transistor 21 and to also extend partially under the gate of reset transistor 21. By substantially surrounding the n+ source region 25 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

Another feature of the present invention as illustrated in FIG. 18, is the shape of the n-well photodiode area 310. As illustrated in FIG. 18, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

The n-well region 310 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 300 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

Figure 19:
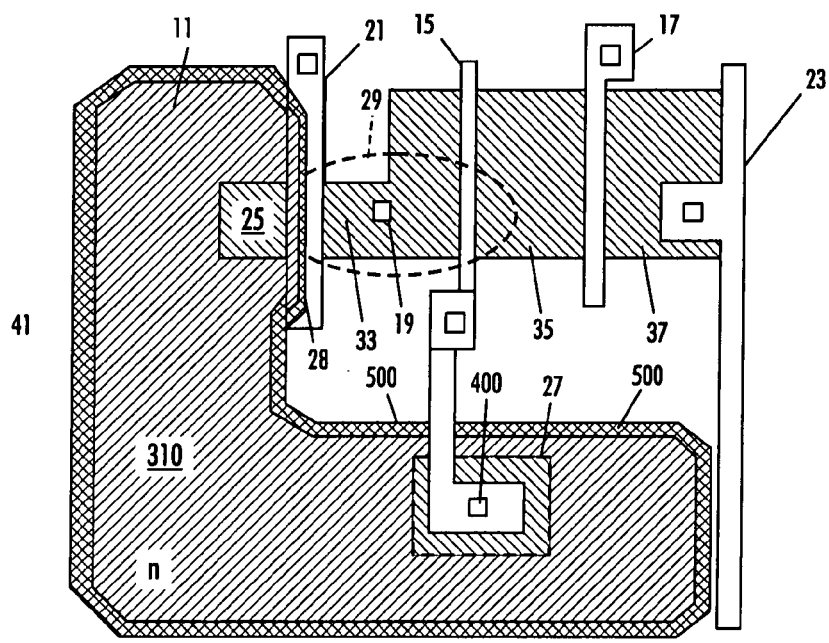
FIG. 19 is a fourth embodiment of a CMOS fabrication process layout for a pixel with poly silicon region at a periphery of the diode junction according to the concepts of the present invention.

A further embodiment of a CMOS fabrication process layout for a pixel according to the concepts of the present invention is illustrated in FIG. 19. As illustrated in FIG. 19, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

In this embodiment, an n+ source region 25 is located within the photodiode region 11 such that a portion of the outer perimeter or boundary of the photodiode region 11, represented by the dashed line 28 in FIG. 19, actually extends partially under the gate of reset transistor 21. The boundary or perimeter region of the photodiode 11 has a continuous oxide layer thickness thereupon with no step across the boundary or perimeter region of the photodiode 11. Thus, the corresponding depletion region in FIG. 19 has substantially reduced material defects therein, such as crystal dislocations, which can be electron-hole generation centers and generate unwanted leakage current.

The source and drain regions 33, 35, and 37 of the transistors (21, 15, and 17) are doped n+ in a conventional manner. The source and drain region 33 includes a contact 19 to provide a connection to voltage $V_{DD}$.

The n+ source region 25 of the reset transistor 21 is configured to contact the photodiode 11 by forming the source region 25 within the n-well photodiode area 310, as a shallow n+ well in the relatively deeper n-well region 310. By locating the source region 25 within the n-well photodiode area 310, the portion 28 of the n-well photodiode area 310 extends partially under a portion of the gate of the reset transistor 21, thereby effectively surrounding the n+ dopant source region 25 by a deeper n-well region. This deeper n-well region forms a tub region around the n+ dopant source region 25.

The n-well region 310 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 300 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

As also illustrated in FIG. 19, according to the concepts of the present invention, the pixel's sense node contact 400 is provided in the n-well photodiode area 310. Thus, the n-well photodiode area 310 is itself the sense node region, together with the reset transistor source 25.

Figure 20:
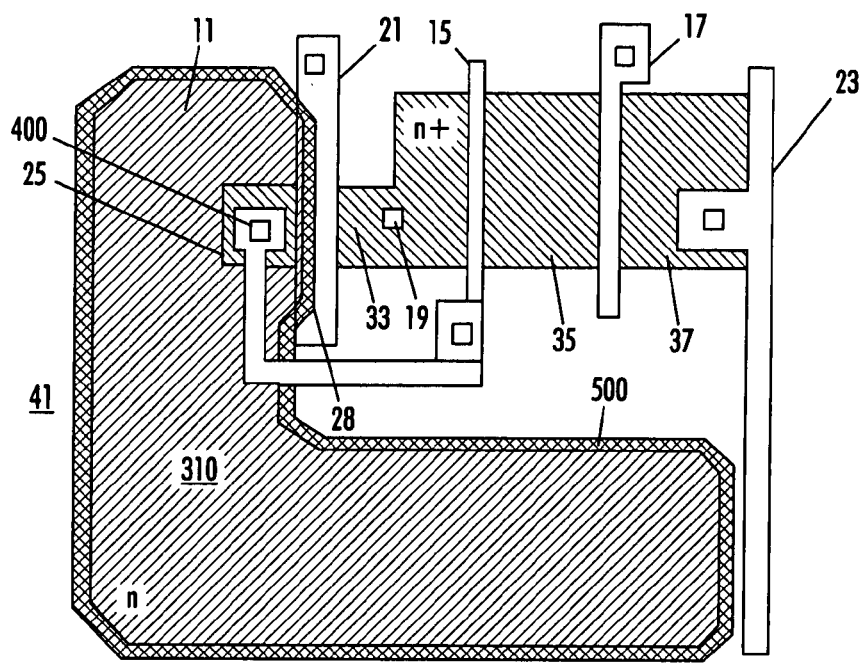
FIG. 20 is another embodiment of a CMOS fabrication process layout for a pixel with poly silicon region at a periphery of the diode junction according to the concepts of the present invention.

In accordance with the present invention, the contact 400 between the gate of the source follower transistor 15 and the sense node can be made at any point in the n-well photodiode area 310, either within the reset transistor source region 25, as illustrated in FIG. 20, or the n-well photodiode area 310, as illustrated in FIG. 19.

As illustrated in FIG. 19, according to the concepts of the present invention, the sense node contact 400 is not located at the perimeter or boundary of the photodiode area 310, but instead, the sense node contact 400 is located at some point away from the perimeter of the photodiode area 310. In order to ensure sufficient ohmic contact between the metal of the sense node contact 400 and the photodiode area 310, it is preferred that an n+ region 27 be provided surrounding the sense node contact 400. This n+ region 27 would preferably extend under and beyond sense node contact 400. While not required, the n+ region 27 can be preferred for most applications.

The n+ region 27 can be formed simultaneously with the source and drain regions (25, 33, 35, and 37) of the pixel transistors and thus no additional fabrication steps need to be added to a standard CMOS fabrication process.

As noted above, the oxide step associated with the n+ region 27 does not cause effective current leakage or defective pixels. The diffusion of the n-well photodiode area 310 is relatively deep, e.g., about 1 µm. As a result, the P-N junction and depletion region formed with the p-type substrate 41 at the horizontal side of the n-well photodiode area 310 are not located at the oxide step associated with the n+ region 27. Crystal dislocations formed at the substrate surface in the area of the oxide step associated with the n+ region 27 cannot, in general, extend to the surface P-N junction and corresponding depletion region resulting from the use of the n-well photodiode area 310 according to the concepts of the present invention.

Moreover, the P-N junction and depletion region formed with the p-type substrate 41 at the vertical bottom of the n-well photodiode area 310 are far below the substrate surface at the location of the oxide step associated with the n+ region 27. Crystal dislocations formed at the substrate surface in the area of the oxide step associated with the n+ region 27 cannot, in general, extend to the deeper P-N junction and corresponding depletion region resulting from the use of the n-well photodiode area 310 according to the concepts of the present invention.

Thus, the crystal dislocations associated with oxide step associated with the n+ region 27 of FIG. 19 are formed at a location that is substantially too far from the P-N junction and depletion region for effective leakage current to be generated.

In the embodiment illustrated by FIG. 19, the dopant-concentrated region 27 is positioned within the doped well region 310 such that the doped well region 310 completely surrounds the dopant-concentrated region 27, and any transition regions causing stress-induced dislocations in the oxide layer are not located at the depletion region 260 formed around the perimeter of the doped well region 310. In other words, any transition regions causing stress-induced dislocations in the oxide layer are located in an area that is outside the depletion region formed around the perimeter of the doped well region 310.

As illustrated in FIG. 20, according to the concepts of the present invention, the sense node contact 400 is not located at the perimeter or boundary of the photodiode area 310, but instead, the sense node contact 400 is located in the reset transistor source region 25.

In the same manner as described above with respect to FIG. 19, the reset transistor source region 25 of FIG. 20 is located within the photodiode 11 such that a portion 28 of the photodiode area 310 is extended partially under the gate of the reset transistor 21 so as to substantially surround the reset transistor source region 25 in a deep well region. The photodiode area 310 is covered with the thick field oxide. As a result, a thin-thick oxide step exists along one perimeter of reset transistor source region 25 inside the n-well photodiode area 310.

As noted above, the oxide step associated with the reset transistor source region 25 of FIG. 20 does not cause effective current leakage or defective pixels. The diffusion of the n-well photodiode area 310 is relatively deep, e.g., about 1 µm. As a result, the P-N junction and depletion region formed with the p-type substrate 41 at the vertical bottom of the n-well photodiode area 310 are far below the substrate surface at the location of the oxide step associated with the reset transistor source region 25. These crystal dislocations formed at the substrate surface in the area of the oxide step associated with the reset transistor source region 25 cannot, in general, extend to the deeper P-N junction resulting from the use of the n-well photodiode area 310 according to the concepts of the present invention.

Also, the thin-thick oxide step associated with the reset transistor source region 25 of FIG. 20 is within the n-well photodiode area 310, away from the perimeter of the n-well photodiode area 310, and therefore is away from locations at which the P-N junction and depletion region between the n-well photodiode area 310 and the p-type substrate 41 are near to the substrate surface. As a result, the reset transistor source region 25 doping produces no effective dislocation-induced leakage current.

In other words, the oxide layer of FIG. 20 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

In this embodiment, the dopant-concentrated region 25 is positioned within the doped well region 310 such that the doped well region 310 completely surrounds the dopant-concentrated region 25 and a portion of the doped well region 310 extends partially under the gate of the reset transistor 21, thereby any transition regions causing stress-induced dislocations in the oxide layer are not located at the depletion region formed around the perimeter of the doped well region 310. In other words, the transition regions causing stress-induced dislocations in the oxide layer are located in an area that is outside the depletion region formed around the perimeter of the doped well region 310.

The n-well region 310 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 300 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

With respect to FIGS. 19 and 20, in accordance with the concepts of the present invention, the source and drain geometries of the various pixel transistors can be tailored to meet the performance specifications for each transistor. For example, the source and drain regions can be made wider for the source-follower transistor 15 and row select transistor 17, to enable higher driving capabilities of the transistors.

As illustrated in FIGS. 19 and 20, with respect to the boundaries of the other n+ source/drain regions (33, 35, and 37) with the substrate, these boundaries have oxide steps associated therewith, but the current produced therefrom is not a problem. It is only the current produced at regions having the same dopant type and the same electrical potential as the photodiode that is the problem.

It is noted that FIG. 20 is another example of where n+ dopant source region 25, a terminal of the reset transistor 21, is formed within the photodiode 11 so that an electrical connection is provided between the photodiode 11 and the n+ dopant source region 25, and the step associated with the n+ dopant source region 25 is not associated with the depletion region of the n-well photodiode area 310 and the substrate.

Figure 21:
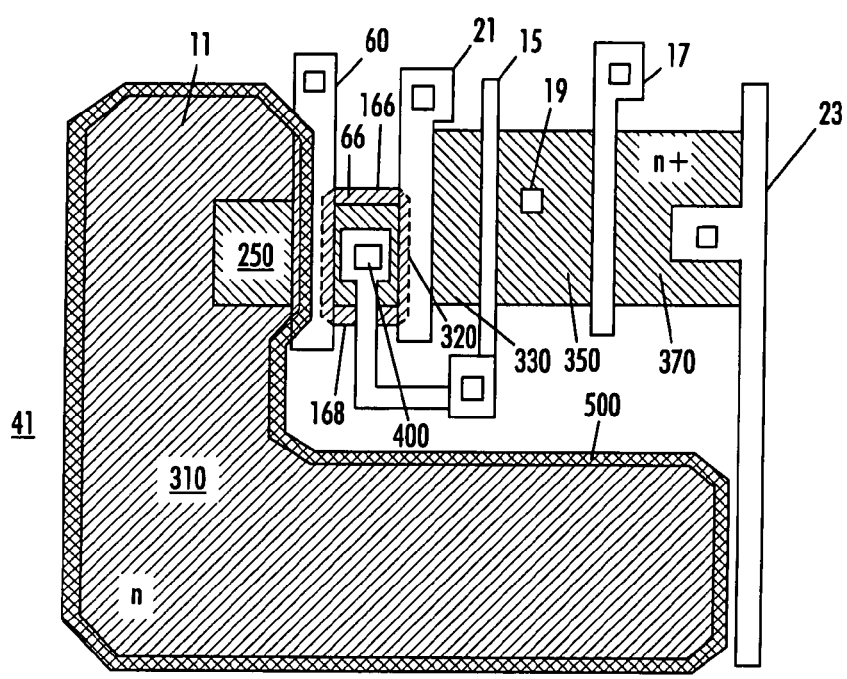
FIG. 21 is a further embodiment of a CMOS fabrication process layout for a pixel with poly silicon region at a periphery of the diode junction according to the concepts of the present invention.

FIG. 21 illustrates a layout for the CMOS pixel according to the concepts of the present invention. Like the pixel layouts of FIGS. 19 and 20, the pixel layout of FIG. 21 employs an n-well photodiode area 310. The source 250 of the cascode transistor 60 is formed by an n+ shallow diffusion within the n-well photodiode area 310. As with FIGS. 19 and 20, the source 250 of the cascode transistor 60 is located such that a portion of the n-well photodiode area 310 substantially surrounds the source 250 and partially extends under a portion of the gate of the cascode transistor 60. As a result, a thin-thick oxide step exists along one perimeter of reset transistor source region 250 inside the n-well photodiode area 310.

This n+ source region 250 is preferably formed simultaneously with the n+ source and drain regions (310, 330, 350, and 370) of the other pixel transistors and thus no additional fabrication steps need to be added to a standard CMOS fabrication process. The source and drain region 350 includes a contact 19 to provide a connection to voltage $V_{DD}$.

The n-well photodiode area 310 is preferably formed simultaneously with n-wells formed in the substrate for PMOS circuitry and thus no additional fabrication steps need to be added to a standard CMOS fabrication process.

As illustrated in FIG. 21, the sense node contact 400 is located at the drain/source connection region 320 between the cascode transistor 60 and the reset transistor 21. The drain/source connection region 320 defines the drain of the cascode transistor 60 and the source of the reset transistor 21 and thus is an n+ substrate region in which a thin gate oxide covers the substrate. The edges of the drain/source connection region 320 between the two gates of the transistors 60 and 21 that would normally form the boundary between the drain/source connection region 320 and the field area 41 are bounded by the thick field oxide. As a result, dislocations can form at near-surface substrate locations and contribute leakage current to the pixel signal measured at the sense node contact 400.

Another feature of the present invention as illustrated in FIG. 21, is the shape of the n-well photodiode area 310 and the n-type well region 66. As illustrated in FIG. 11, the n-well photodiode area 310 and the n-type well region 66 have no right angles included in their geometry. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 and the n-type well region 66 are obtuse angles.

The n-well region 310 of the photodiode 11 is further gated, according to the concepts of the present invention, with a poly silicon region 500 at its periphery. In other words, the poly silicon region 500 is formed along the periphery of the diode junction. The poly silicon region 500 physically shields the surface intersection of the p-n junction between the n-well region 310 of the photodiode 11 and the p-type substrate 41 to prevent any process damage from being introduced after the poly silicon processing (including damages from processes such as dielectric deposition/pattern, metal deposition/pattern and via/contact hole etching). Moreover, the poly-silicon region 500 can provide electric shielding to prevent any possible trapped charges at higher levels of dielectric above the junctions to affect the surface potential and form conducting channels between the p-n regions.

With respect to the illustrations of FIGS. 17-21, for illustrative purposes only, the poly silicon gate regions either overlap or underlie the reset (or cascode) gate, illustrating two gate layers. Although the present invention, in the FIGS. 17-21, illustrates two gate layers, the concepts of the present invention are readily applicable to a single gate layer as illustrated in FIG. 16. In other words, FIGS. 17-21 simply demonstrate the overall concept of the present invention, not necessarily the physical layout of the present invention. When the poly silicon/electrical shield region along the photodiode periphery is at the same layer as the transistor gates (21, 15, and/or 17), the poly silicon/electrical shield maintains a minimum layout spacing rule with the transistor ploy gates (21, 15, and/or 17).

It is further noted that in the various Figures described above with respect to the concepts of the present invention, the n-well region 310 is also electrically connected to a CMOS readout circuit (not shown).

In summary, the present invention provides a CMOS pixel design that substantially eliminates dislocation-induced pixel leakage current and that correspondingly reduces pixel defect density caused by substrate dislocations. Furthermore, the present invention enables this enhancement without modification of standard CMOS fabrication processes. Moreover, the present invention physically shields the p-n junction of the photodiode to prevent any process damage from being introduced after the poly silicon processing (including damages from processes such as dielectric deposition/pattern, metal deposition/pattern and via/contact hole etching). In addition, the present invention provides electric shielding to prevent any possible trapped charges at higher levels of dielectric above the junctions to affect the surface potential and form conducting channels between the p-n regions.

More specifically, according to the concepts of the present invention, a dopant-concentrated region is positioned within a doped well region such that the doped well region completely surrounds the dopant-concentrated region, and any transition regions causing stress-induced dislocations in the oxide layer are not located at the depletion region formed around the perimeter of the doped well region. In other words, the transition regions causing stress-induced dislocations in the oxide layer are located in an area that is outside the depletion region formed around the perimeter of the doped well region.

Also, according to the concepts of the present invention, a poly silicon region is applied over and surrounding the junction of the Nwell-Psub diode at the surface to physically shield the surface intersection of the p-n junction of the photodiode and provide electric shielding to prevent any possible trapped charges at higher levels of dielectric above the junctions to affect the surface potential and form conducting channels between the p-n regions.

The concepts of the present invention provide flexibility in the design paradigm of the pixel layout.

Furthermore, although the descriptions above used specific pixel circuit configuration, the concepts of the present invention are not limited to a particular pixel circuit configuration.

Moreover, although the various descriptions above utilized an underlying substrate of a p-type region and the active areas of n-type regions, the concepts of the present invention can be applicable to pixel layouts where the underlying substrate is an n-type region and the active areas are p-type regions.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A semiconductor structure, comprising:
   a substrate layer of a first dopant type having a first surface;
   a doped well region having a second surface and being of a second dopant type;
   a diode junction at an interface between said substrate layer and said doped well region;
   a transistor having a terminal, said terminal of said transistor being provided within said doped well region, said terminal of said transistor being of said second dopant type and of a dopant concentration greater than a dopant concentration of said doped well region; and
   an oxide layer formed over said substrate layer, said doped well region, and said terminal of said transistor, said oxide layer having a constant height across a perimeter of said doped well region and a varying height away from said perimeter of said doped well region.

2. The semiconductor structure as claimed in claim 1, wherein said doped well region is of a predetermined shape having a multitude of corners, a plurality of said corners of said doped well region being non-right angles.

3. The semiconductor structure of claim 1, wherein said doped well region being formed in said substrate layer such that said first surface and said second surface are substantially co-planar to form a diode surface and an interface between said doped well region and said substrate layer at said diode surface forms the diode junction.

4. The semiconductor structure of claim 1, further comprising:
   a poly silicon region formed along a periphery of said diode junction.

5. The semiconductor structure as claimed in claim 4, wherein said first dopant type is p-type, said second dopant type is n-type, said dopant of said terminal of said transistor is an n+ dopant, and said poly silicon region is doped.

6. The semiconductor structure as claimed in claim 4, wherein said first dopant type is n-type, said second dopant type is p-type, said dopant of said terminal of said transistor is a p+ dopant, and said poly silicon region is doped.

7. The semiconductor structure as claimed in claim 4, wherein said poly silicon region is electrically biased at a fixed potential.

8. The semiconductor structure as claimed in claim 4, wherein said poly silicon region is electrically connected to a poly silicon region of an adjacent pixel site.

9. The semiconductor structure as claimed in claim 7, wherein said poly silicon region is electrically connected to a poly silicon region of an adjacent pixel site.

10. The semiconductor structure of claim 4, wherein the oxide layer is formed over said substrate layer, said doped well region, said poly silicon region, and said terminal of said transistor.

11. The semiconductor structure of claim 1, wherein:
    said transistor having a gate, said gate being formed over a portion of said diode junction.

12. The semiconductor structure of claim 1, wherein said oxide layer having a varying height such that a height of said oxide layer associated with said doped well region is thicker than a height of said oxide layer associated with said terminal of said transistor.

13. The semiconductor structure of claim 12, wherein said oxide layer includes a step region, said step region being located where said height of said oxide layer transitions from said height associated with said doped well region to said height associated with said terminal of said transistor.

14. The semiconductor structure of claim 13, wherein said step region is located within the doped well region and away from the photodiode junction.

15. The semiconductor structure of claim 13, wherein said step region is located at an effective distance from the photodiode junction to eliminate adverse effects from leakage current caused by crystal dislocations associated with said step region.

16. The semiconductor structure of claim 1, wherein said doped well region forms a depletion region with said substrate when a reverse bias voltage is applied across said substrate layer and said doped well region.

17. The semiconductor structure of claim 1, further comprising:
    a photodiode formed of said doped well region within said substrate layer.

18. The semiconductor structure of claim 17, further comprising:
    a sense node contact connected to said photodiode and said transistor, said sense node contact being provided within said doped well region of said photodiode.

19. The semiconductor structure of claim 1, wherein:
    said transistor having a source, a drain and a gate, said source being provided as a region of source dopant within said well region, said source dopant being of said second dopant type and of a dopant concentration that is higher than a dopant concentration of said well, and said gate extending over a portion of said well region located between said source and drain.

* * * * *